United States Patent
Kotake et al.

(10) Patent No.: US 10,323,126 B2
(45) Date of Patent: Jun. 18, 2019

(54) SILOXANE COMPOUND, MODIFIED IMIDE RESIN, THERMOSETTING RESIN COMPOSITION, PREPREG, FILM WITH RESIN, LAMINATED PLATE, MULTILAYER PRINTED WIRING BOARD, AND SEMICONDUCTOR PACKAGE

(71) Applicant: HITACHI CHEMICAL COMPANY, LTD., Tokyo (JP)

(72) Inventors: Tomohiko Kotake, Ibaraki (JP); Shunsuke Nagai, Ibaraki (JP); Shintaro Hashimoto, Ibaraki (JP); Shinichiro Abe, Ibaraki (JP); Masato Miyatake, Ibaraki (JP); Shin Takanezawa, Ibaraki (JP); Hikari Murai, Ibaraki (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 481 days.

(21) Appl. No.: 14/093,174

(22) Filed: Nov. 29, 2013

(65) Prior Publication Data
US 2014/0192501 A1 Jul. 10, 2014

Related U.S. Application Data

(60) Provisional application No. 61/730,654, filed on Nov. 28, 2012.

(51) Int. Cl.
| H05K 1/03 | (2006.01) |
| H05K 3/02 | (2006.01) |
| C08G 12/08 | (2006.01) |
| C08G 73/10 | (2006.01) |

(52) U.S. Cl.
CPC .......... C08G 73/106 (2013.01); C08G 12/08 (2013.01); H05K 1/0326 (2013.01); H05K 1/0366 (2013.01); H05K 3/022 (2013.01); H05K 2201/0162 (2013.01)

(58) Field of Classification Search
CPC ................. C08G 12/08; C08G 77/04
See application file for complete search history.

(56) References Cited

U.S. PATENT DOCUMENTS

| 3,516,971 A * | 6/1970 | Alelio ............... C08G 12/08 528/162 |
| 5,066,765 A * | 11/1991 | Wada ............... C08G 63/6856 528/176 |
| 5,807,961 A * | 9/1998 | Sawai ............... C08G 73/101 428/473.5 |
| 2005/0202261 A1 * | 9/2005 | Takai ............... H05K 3/386 428/458 |
| 2007/0287021 A1 | 12/2007 | Takeuchi et al. |
| 2007/0290172 A1 * | 12/2007 | Momose ............... C08J 3/226 252/301.16 |
| 2008/0302558 A1 | 12/2008 | Takeuchi et al. |
| 2010/0144977 A1 * | 6/2010 | Dershem ............... C07C 215/50 525/408 |
| 2013/0330563 A1 | 12/2013 | Kotake et al. |

(Continued)

FOREIGN PATENT DOCUMENTS

| CN | 1444270 A | 9/2003 |
| CN | 1930219 A | 3/2007 |
| CN | 101070387 A | 11/2007 |

(Continued)

OTHER PUBLICATIONS

Machine Translation of JP 2011195476 A, 2016.*
Racles et al. High Performance Polymers, 19, 541-552, 2007.*
Vasiliu et al. (Polymer-Plastics Technology and Engineering, 44, 993-1002, 2005).*
Machine translation of FR-2647456-A1 (Year: 2018).*
Milano, J.C. et al., "Synthese De Bismaleimides Et Polybismaleirnides A Pont Siloxanique—Reactivite Et Tenue Thermique", Eur. Polym. J., 1997 (received Dec. 19, 1995), pp. 1333-1340, vol. 33, No. 8, Elsevier Science Ltd., Great Britain.

(Continued)

*Primary Examiner* — Liam J Heincer
(74) *Attorney, Agent, or Firm* — Fitch, Even, Tabin & Flannery, L.L.P.

(57) ABSTRACT

A siloxane compound containing structures represented by the following general formulae (1) and (2):

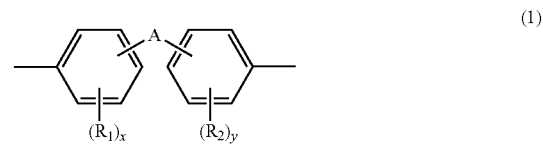

wherein $R_1$ and $R_2$ independently represent a hydrogen atom, a halogen atom, an alkyl group having from 1 to 3 carbon atoms, a halogenated alkyl group, a thiol group, an acetyl group, a hydroxyl group, a sulfonic acid group, a sulfoalkoxyl group having from 1 to 3 carbon atoms, or an alkoxyl group having from 1 to 3 carbon atoms; x and y independently represent an integer of from 0 to 4; and A represents a single bond or an azomethine group, an ester group, an amide group, an azoxy group, an azo group, an ethylene group, or an acetylene group, and

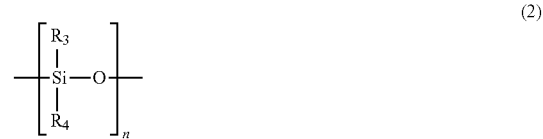

wherein $R_3$ and $R_4$ independently represent an alkyl group, a phenyl group, or a substituted phenyl group; and n represents an integer of from 1 to 100.

17 Claims, No Drawings

(56) References Cited

U.S. PATENT DOCUMENTS

2016/0060399 A1 * 3/2016 Abe .................. C08G 77/448
525/474

FOREIGN PATENT DOCUMENTS

| | | |
|---|---|---|
| CN | 101223181 A | 7/2008 |
| CN | 101965387 A | 2/2011 |
| FR | 2647456 A1 * | 11/1990 ............ C08G 77/38 |
| JP | S51-138800 A | 11/1976 |
| JP | S60-101123 A | 6/1985 |
| JP | S60-181127 A | 9/1985 |
| JP | S63-193925 A | 8/1988 |
| JP | 01-069631 | 3/1989 |
| JP | 01-079233 | 3/1989 |
| JP | 03-012424 A | 1/1991 |
| JP | 03-012425 A | 1/1991 |
| JP | 05-140067 A | 6/1993 |
| JP | 2003-073470 A | 3/2003 |
| JP | 2011-195476 A | 10/2011 |
| JP | 2011195476 A * | 10/2011 |
| JP | 2012-167234 A | 9/2012 |
| JP | 2014-129520 A | 10/2014 |
| TW | 201229137 A | 7/2012 |
| TW | 201245284 A1 | 11/2012 |
| WO | 2014-084310 A1 | 6/2014 |
| WO | 2014/084318 A1 | 6/2014 |

OTHER PUBLICATIONS

Office Action dated Apr. 29, 2016, for Chinese Application No. 201380061809.9.

Office Action dated Feb. 7, 2017, for Taiwanese Patent Application No. 102143669.

"Encyclopedia of Polymer Science and Technology—Plastics, Resins, Rubbers, Fibers", vol. 10, John Wiley & Sons, Inc., 1969, pp. 659-670.

Office Action dated Mar. 17, 2017, in corresponding Taiwanese Application No. 102143668.

* cited by examiner

SILOXANE COMPOUND, MODIFIED IMIDE RESIN, THERMOSETTING RESIN COMPOSITION, PREPREG, FILM WITH RESIN, LAMINATED PLATE, MULTILAYER PRINTED WIRING BOARD, AND SEMICONDUCTOR PACKAGE

TECHNICAL FIELD

The present invention relates to a siloxane compound which is suitable for semiconductor packages or printed wiring boards and to a modified imide resin, a thermosetting resin composition, a prepreg, a film with resin, a laminated plate, a multilayer printed wiring board, and a semiconductor package each using the same.

BACKGROUND ART

Associated with a trend toward miniaturization and high performance of an electronic device in recent years, in a multilayer printed wiring board, high wiring density and high integration have been developed. Following this, a demand for reliability enhancement due to enhancement in heat resistance of a laminated plate for multilayer printing wiring is being strengthened. In such an application, particularly in a semiconductor package, the laminated plate is required to have both excellent heat resistance and low thermal expansion properties. In addition, dielectric properties responding to high frequency of electric signals are also required.

In this issue, though known liquid crystalline polymers such as polyesters, polyamides, polycarbonates, polythiols, polyethers, polyazomethines, etc. are a thermosetting resin having excellent low thermal expansion properties, dielectric properties, and heat resistance, they involved a problem in workability or moldability and also a problem of difficulty in handling because of low solubility in an organic solvent.

Among these liquid crystalline polymers, since G.F.D'Alelio discovered a polyazomethine that is a liquid crystalline oligomer (see NPL 1), a large number of examples regarding resins using a polyazomethine have been reported (see PTLs 1 to 7).

PTL 1 discloses a variety of polyazomethines, and PTLs 2 to 7 disclose polyazomethines having a specific structure. In addition, PTLs. 8 and 9 disclose thermosetting polyazomethine resins containing an unsaturated group and describe that high heat resistance is revealed by these resins.

CITATION LIST

Patent Literature

[PTL 1] JP-A-51-138800
[PTL 2] JP-A-60-181127
[PTL 3] JP-A-60-101123
[PTL 4] JP-A-2003-073470
[PTL 5] JP-A-63-193925
[PTL 6] JP-A-01-069631
[PTL 7] JP-A-01-079233
[PTL 8] JP-A-05-140067
[PTL 9] JP-A-2011-195476

Non Patent Literature

[NPL 1] *Polymer Sci. Tech.*, Wiley-Interscience, New York, 1969, Vol. 10, pp. 659-670

SUMMARY OF INVENTION

Technical Problem

However, in the case where the polyazomethines described in PTLs 1 to 7 are applied as a copper clad laminated plate or an interlayer insulating material, there is a concern that their heat resistance or moldability is insufficient.

In addition, the thermosetting polyazomethine resins described in PTL 8 are still insufficient regarding an improvement in heat resistance or toughness, and in the case where these are used as a copper clad laminated plate or an interlayer insulating material, there is also a concern that their heat resistance, reliability, workability, or the like is insufficient.

Furthermore, the thermosetting polyazomethine resins described in PTL 9 were not satisfactory from the standpoint of low cure shrinkage or low thermal expansion properties.

In view of such present conditions, an object of the present invention is to provide a siloxane compound which when applied to a variety of applications, is able to realize a thermosetting resin composition exhibiting excellent low cure shrinkage, low thermal expansion properties, good dielectric properties, and high elastic modulus, a modified imide resin, a thermosetting resin composition, and a prepreg, a film with resin, a laminated plate, a multilayer printed wiring board, and a semiconductor package each using the same.

Solution to Problem

In order to achieve the above-described object, the present inventors made extensive and intensive investigations. As a result, it has been found that the above-described object can be achieved by using a modified siloxane compound having an aromatic azomethine, leading to accomplishment of the present invention. The present invention is made on the basis of such knowledge.

Specifically, the present invention is to provide a siloxane compound, a modified imide resin, a thermosetting resin composition, a prepreg, a film with resin, a laminated plate, a multilayer printed wiring board, and a semiconductor package as described below.

[1] A siloxane compound containing structures represented by the following general formulae (1) and (2):

[Chem. 1]

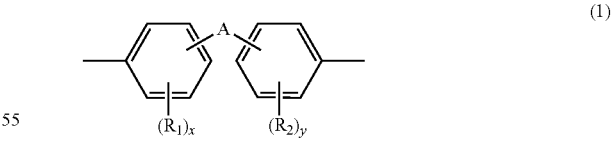

(1)

(In the formula, each of $R_1$ and $R_2$ independently represents a hydrogen atom, a halogen atom, an alkyl group having from 1 to 3 carbon atoms, a halogenated alkyl group, a thiol group, an acetyl group, a hydroxyl group, an sulfonic acid group, a sulfoalkoxyl group having from 1 to 3 carbon atoms, or an alkoxyl group having from 1 to 3 carbon tomes; each of x and y independently represents an integer of from 0 to 4; and A represents a single bond or an azomethine group, an ester group, an amide group, an azoxy group, an azo group, an ethylene group, or an acetylene group.)

[Chem. 2]

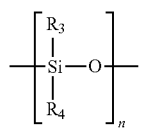
(2)

(In the formula, each of $R_3$ and $R_4$ independently represents an alkyl group, a phenyl group, or a substituted phenyl group; and n represents an integer of from 1 to 100.)

[2] The siloxane compound as set forth in [1], further containing an aromatic azomethine.

[3] The siloxane compound as set forth in [2], obtained by allowing an aromatic amine compound (A) having at least two primary amino groups in one molecule thereof, an aromatic aldehyde compound (B) having at least two aldehyde groups in one molecule thereof, and a siloxane compound (C) having at least two amino groups in a molecular terminal thereof to react with each other.

[4] The siloxane compound as set forth in [2], obtained by allowing an aromatic amine compound (A) having at least two primary amino groups in one molecule thereof and an aromatic aldehyde compound (B) having at least two aldehyde groups in one molecule thereof to react with each other, followed by reaction with a siloxane compound (C) having at least two amino groups in a molecular terminal thereof.

[5] The siloxane compound as set forth in [2], obtained by allowing an aromatic aldehyde compound (B) having at least two aldehyde groups in one molecule thereof and a siloxane compound (C) having at least two amino groups in a molecular terminal thereof to react with each other, followed by reaction with an aromatic amine compound (A) having at least two primary amino groups in one molecule thereof.

[6] A modified imide resin having an aromatic azomethine, obtained by allowing the siloxane compound as set forth in any one of [1] to [5] and a maleimide compound (D) having at least two N-substituted maleimide groups in one molecule thereof to react with each other.

[7] The modified imide resin as set forth in [6], further having an acidic substituent, the acidic substituent being derived from an acidic substituent of an amine compound (E) represented by the following general formula (3):

[Chem. 3]

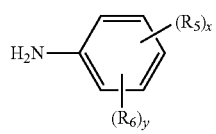
(3)

(In the formula, each $R_5$ independently represents a hydroxyl group, a carboxyl group, or a sulfonic acid group, each of which is an acidic substituent; each $R_6$ independently represents a hydrogen atom, an aliphatic hydrocarbon group having from 1 to 5 carbon atoms, or a halogen atom; x represents an integer of from 1 to 5; and y represents an integer of from 0 to 4, provided that the sum of x and y is 5.)

[8] A thermosetting resin composition containing the siloxane compound as set forth in any one of [1] to [5] and a maleimide compound (D) having at least two N-substituted maleimide groups in one molecule thereof.

[9] The thermosetting resin composition as set forth in [8], further containing an amine compound (E) having an acidic substituent, which is represented by the following general formula (3):

[Chem. 4]

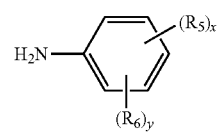
(3)

(In the formula, each $R_5$ independently represents a hydroxyl group, a carboxyl group, or a sulfonic acid group, each of which is an acidic substituent; each $R_6$ independently represents a hydrogen atom, an aliphatic hydrocarbon group having from 1 to 5 carbon atoms, or a halogen atom; x represents an integer of from 1 to 5; and y represents an integer of from 0 to 4, provided that the sum of x and y is 5.)

[10] The thermosetting resin composition as set forth in [8] to [9], further containing a thermoplastic elastomer (F).

[11] The thermosetting resin composition as set forth in any one of [8] to [10], further containing at least one thermosetting resin (G) selected from an epoxy resin and a cyanate resin.

[12] The thermosetting resin composition as set forth in any one of [8] to [11], further containing an inorganic filler (H).

[13] The thermosetting resin composition as set forth in any one of [8] to [12], further containing a curing accelerator (I).

[14] A prepreg comprising a base material impregnated with the thermosetting resin composition as set forth in any one of [8] to [13].

[15] A film with resin comprising a support subjected to layer forming with the thermosetting resin composition as set forth in any one of [8] to [13].

[16] A laminated plate, obtained by subjecting the prepreg as set forth in [14] to laminate molding.

[17] A laminated plate, obtained by subjecting the film with resin as set forth in [15] to laminate molding.

[18] A multilayer printed wiring board, prepared using the laminated plate as set forth in [16] or [17].

[19] A semiconductor package comprising a semiconductor device mounted on the multilayer printed wiring board as set forth in [18].

Advantageous Effects of Invention

According to the present invention, it is possible to provide a siloxane compound which when applied to a variety of applications, is able to realize a thermosetting resin composition exhibiting excellent low cure shrinkage, low thermal expansion properties, good dielectric properties, and high elastic modulus, a modified imide resin, a thermosetting resin composition, and a prepreg, a film with resin, a laminated plate, a multilayer printed wiring board, and a semiconductor package each using the same.

In particular, a prepreg obtained by impregnating and coating a base material with a thermosetting resin composition containing the modified siloxane compound having an aromatic azomethine of the present invention, a film with resin obtained by coating a support with the thermosetting resin composition, and a laminated plate prepared by subjecting the prepreg to laminate molding have especially low cure shrinkage, low thermal expansion properties, excellent dielectric properties, and high elastic modulus and are useful as a multilayer printed wiring board and a semiconductor package.

DESCRIPTION OF EMBODIMENTS

The present invention is hereunder described in detail.
(Siloxane Compound)
The siloxane compound of the present invention contains structures represented by the following general formulae (1) and (2). Such structures are obtained by allowing a compound containing a structure represented by the following general formula (1) and a compound containing a structure represented by the following general formula (2) to react with each other.

[Chem. 5]

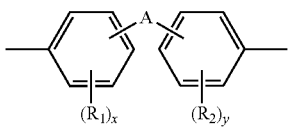

(1)

(In the formula, each of $R_1$ and $R_2$ independently represents a hydrogen atom, a halogen atom, an alkyl group having from 1 to 3 carbon atoms, a halogenated alkyl group, a thiol group, an acetyl group, a hydroxyl group, an sulfonic acid group, a sulfoalkoxyl group having from 1 to 3 carbon atoms, or an alkoxyl group having from 1 to 3 carbon tomes; each of x and y independently represents an integer of from 0 to 4; and A represents a single bond or an azomethine group, an ester group, an amide group, an azoxy group, an azo group, an ethylene group, or an acetylene group.)

[Chem. 6]

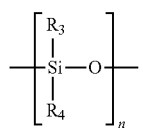

(2)

(In the formula, each of $R_3$ and $R_4$ independently represents an alkyl group, a phenyl group, or a substituted phenyl group; and n represents an integer of from 1 to 100.)

In addition, it is preferable that the siloxane compound of the present invention contains an aromatic azomethine.

The aromatic azomethine as referred to herein refers to one in which at least one aromatic group is bonded to a Schiff's base (—N=CH—).

The siloxane compound of the present invention is hereunder described in detail.

The siloxane compound of the present invention is obtained by allowing an aromatic amine compound (A) having at least two primary amino groups in one molecule thereof (hereinafter sometimes referred to as "aromatic amine compound (A)"), an aromatic aldehyde compound (B) having at least two aldehyde groups in one molecule thereof (hereinafter sometimes referred to as "aromatic aldehyde compound (B)"), and a siloxane compound (C) having at least two amino groups in a molecular terminal thereof (hereinafter sometimes referred to as "siloxane compound (C)") to react with each other.

Examples of the aromatic amine compound (A) having at least two primary amino groups in one molecule thereof according to the present invention include p-phenylenediamine, m-phenylenediamine, o-phenylenediamine, 3-methyl-1,4-diaminobenzene, 2,5-dimethyl-1,4-diaminobenzene, 4,4'-diaminodiphenylmethane, 4,4'-diamino-3,3'-dimethyl-diphenylmethane, 4,4'-diamino-3,3'-diethyl-diphenylmethane, 4,4'-diaminodiphenyl ether, 4,4'-diaminodiphenylsulfone, 3,3'-diaminodiphenylsulfone, 4,4'-diaminodiphenyl ketone, benzidine, 3,3'-dimethyl-4,4'-diaminobiphenyl, 2,2'-dimethyl-4,4'-diaminobiphenyl, 3,3'-dihydroxybenzidine, 2,2-bis(3-amino-4-hydroxyphenyl)propane, 3,3-dimethyl-5,5-diethyl-4,4-diphenylmethanediamine, 2,2-bis(4-aminophenyl)propane, 2,2-bis(4-(4-aminophenoxy)phenyl)propane, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, bis(4-(4-aminophenoxy)phenyl)sulfone, bis(4-(3-aminophenoxy)phenyl)sulfone, 9,9-bis(4-aminophenyl)fluorene, 4,4'-diaminobenzanilide, bis(4-aminophenyl)terephthalamide, 4-aminophenyl-4'-aminobenzoate, 3,5-diaminobenzyl benzoate, 4,4'-diaminoazobenzene, 3,3'-diamino-2,2'-dimethylazoxybenzene, (E)-4,4'-diaminostilbene, (Z)-4,4'-diaminostilbene, 4,4'-diaminostilbene-2,2'-disulfonic acid, 1,3-bis(4-aminophenoxy)-5-(2-phenylethynyl)benzene, and the like. These may be used solely or in admixture of two or more kinds thereof.

Of these, 4,4'-diaminodiphenylmethane, 3,3'-dimethyl-4,4'-diaminobiphenyl, 4,4'-diamino-3,3'-dimethyl-diphenylmethane, 4,4'-diamino-3,3'-diethyl-diphenylmethane, 4,4'-bis(4-aminophenoxy)biphenyl, bis(4-(4-aminophenoxy)phenyl)propane, and the like are more preferable, for example, from the standpoints of high reactivity at the time of reaction and enablement to achieve higher heat resistance. Furthermore, 4,4'-diaminodiphenylmethane, 3,3'-dimethyl-4,4'-diaminobiphenyl, 4,4'-diamino-3,3'-diethyl-diphenylmethane, and bis(4-(4-aminophenoxy)phenyl)propane are preferable from the standpoints of inexpensiveness and solubility in a solvent. Furthermore, 4,4'-diamino-3,3'-diethyl-diphenylmethane and bis(4-(4-aminophenoxy)phenyl)propane are especially preferable from the standpoints of low thermal expansion properties and dielectric properties. In addition, p-phenylenediamine, m-phenylenediamine, 3-methyl-1,4-diaminobenzene, and 2,5-dimethyl-1,4-diaminobenzene are also preferable from the standpoint of enablement to achieve high elastic modulus.

Examples of the aromatic aldehyde compound (B) having at least two aldehyde groups in one molecule thereof according to the present invention include terephthalaldehyde, isophthalaledhyde, o-phthalaldehyde, 2,2'-bipyridine-4,4'-dicarboxaldehyde, and the like. Of these, terephthalaldehyde is especially preferable, for example, from the standpoints of enablement to achieve lower thermal expansion, high reactivity at the time of reaction, excellent solvent solubility, and easiness of commercial availability.

The siloxane compound (C) having at least two amino groups in a molecular terminal thereof according to the present invention contains a structure represented by the following general formula (2).

[Chem. 7]

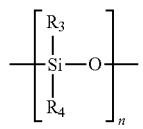

(2)

(In the formula, each of $R_3$ and $R_4$ independently represents an alkyl group, a phenyl group, or a substituted phenyl group; and n represents an integer of from 1 to 100.)

In the formula of the general formula (2), n represents an integer of from 1 to 100, and more preferably an integer of from 2 to 50.

As the siloxane compound (C) having at least two amino groups in a molecular terminal thereof, a commercially available product may be used, too. Examples thereof include "KF-8010" (amino group equivalent: 430), "X-22-161A" (amino group equivalent: 800), "X-22-161B" (amino group equivalent: 1,500), "KF-8012" (amino group equivalent: 2,200), "KF-8008" (amino group equivalent: 5,700), "X-22-9409" (amino group equivalent: 700), and "X-22-1660B-3" (amino group equivalent: 2,200) (all of which are manufactured by Shin-Etsu Chemical Co., Ltd.); "BY-16-853U" (amino group equivalent: 460), "BY-16-853" (amino group equivalent: 650), and "BY-16-853B" (amino group equivalent: 2,200) (all of which are manufactured by Dow Corning Toray Co., Ltd.); and the like. These may be used solely or in admixture of two or more kinds thereof.

Of these, X-22-161A, X-22-161B, KF-8012, X-22-1660B-3, and BY-16-853B are preferable, for example, from the standpoints of high reactivity at the time of synthesis and low thermal expansion properties, and X-22-161A and X-22-161B are especially preferable from the standpoints of excellent compatibility and enablement to achieve high elastic modulus.

In the present invention, examples of the reaction for obtaining the siloxane compound include the following methods.

Reaction Method a: The aromatic amine compound (A) having at least two primary amino groups in one molecule thereof, the aromatic aldehyde compound (B) having at least two aldehyde groups in one molecule thereof, and the siloxane compound (C) having at least two amino groups in a molecular terminal thereof are allowed to react with each other, whereby a siloxane compound (i) can be obtained.

Reaction Method b: First of all, the aromatic amine compound (A) having at least two primary amino groups in one molecule thereof and the aromatic aldehyde compound (B) having at least two aldehyde groups in one molecule thereof are allowed to react with each other to obtain an aromatic azomethine compound having at least one aldehyde group in one molecule thereof. Subsequently, the above-described compound and the siloxane compound (C) having at least two amino groups in a molecular terminal thereof are subjected to a dehydration condensation reaction in an organic solvent, whereby a modified siloxane compound (ii) having an aromatic azomethine can be obtained.

Reaction Method c: First of all, the aromatic aldehyde compound (B) having at least two aldehyde groups in one molecule thereof and the siloxane compound (C) having at least two amino groups in a molecular terminal thereof are allowed to react with each other to obtain a modified siloxane compound having at least one aldehyde group and an azomethine group (—N=CH—) in one molecule thereof. Subsequently, the above-described compound and the aromatic amine compound (A) having at least two primary amino groups in one molecule thereof are allowed to react with each other, whereby a modified siloxane compound (iii) having an aromatic azomethine can be obtained.

The siloxane compound of the present invention can be obtained by adopting any of the above-described Reaction Methods a, b and c. For example, the Reaction Method a is especially simple and easy in the operation and is especially useful in the case where the solvent solubility of the modified siloxane compound of the present invention is insufficient. In addition, the Reaction Method b has such a characteristic feature that it is easy to control the molecular weight of the aromatic azomethine in the molecule of the siloxane compound of the present invention, and this reaction method is especially effective for achieving high elastic modulus of the resin composition containing the same. Furthermore, the Reaction Method c has such a characteristic feature that it is easy to control the molecular weight of the siloxane in the molecule of the siloxane compound of the present invention, and this reaction method is effective for achieving a low coefficient of thermal expansion of the resin composition containing the same.

First of all, the Reaction Method a is described in detail. According to the Reaction Method a, the aromatic amine compound (A) having at least two primary amino groups in one molecule thereof, the aromatic aldehyde compound (B) having at least two aldehyde groups in one molecule thereof, and the siloxane compound (C) having at least two amino groups in a molecular terminal thereof are allowed to react with each other, whereby the siloxane compound (i) of the present invention can be obtained.

Here, as for the use amounts of the aromatic amine compound (A) having at least two primary amino groups in one molecule thereof, the aromatic aldehyde compound (B) having at least two aldehyde groups in one molecule thereof, and the siloxane compound (C) having at least two amino groups in a molecular terminal thereof, it is preferable to use these compounds such that the number of primary amino groups of the aromatic amine compound (A) and the siloxane compound (C) [{use amount of the aromatic amine compound (A)}/{(primary amino group equivalent of the aromatic amine compound (A))+(use amount of the siloxane compound (C))}/{primary amino group equivalent of the siloxane compound (C)}] is in the range of from 1.0 to 10.0 times the number of aldehyde groups of the aromatic aldehyde compound (B) [{use amount of the aromatic aldehyde compound (B)}/{aldehyde group equivalent of the aromatic aldehyde compound (B)}]. When the number of primary amino groups is 1.0 time or more, a lowering of the solubility in a solvent tends to be suppressed. In addition, when the number of primary amino groups is not more than 10.0 times, a lowering of the heat resistance of the thermosetting resin containing the modified siloxane compound (i) having an aromatic azomethine tends to be suppressed.

An organic solvent can be used for this reaction. Though the organic solvent which is used is not particularly limited, examples thereof include alcohol-based solvents such as ethanol, propanol, butanol, methyl cellosolve, butyl cellosolve, propylene glycol monomethyl ether, etc.; ketone-based solvents such as acetone, methyl ethyl ketone, methyl isobutyl ketone, cyclohexanone, etc.; ether-based solvents such as tetrahydrofuran, etc.; aromatic solvents such as toluene, xylene, mesitylene, etc.; nitrogen atom-containing solvents such as dimethylformamide, dimethylacetamide, N-methylpyrrolidone, etc.; sulfur atom-containing solvents such as dimethyl sulfoxide, etc.; ester-based solvents such as γ-butyrolactone, etc.; and the like. These can be used solely or in admixture of two or more kinds thereof. Of these, propylene glycol monomethyl ether, cyclohexanone, toluene, dimethylformamide, dimethylacetamide, and γ-butyrolactone are preferable, for example, from the standpoint of solubility. Furthermore, propylene glycol monomethyl ether and toluene are more preferable from the standpoint that they have high volatility, so that they hardly remain as a residual solvent at the time of preparing a prepreg. In addition, since this reaction is a dehydration condensation reaction, water is formed as a by-product. For the purpose of removing this water that is a by-product, for example, it is desirable to conduct the reaction while removing the water that is a by-product by means of azeotrope with an aromatic solvent.

The use amount of the organic solvent is, for example, preferably from 25 to 2,000 parts by mass, more preferably from 40 to 1,000 parts by mass, and especially preferably from 40 to 500 parts by mass based on 100 parts by mass of a total sum of the aromatic amine compound (A), the aromatic aldehyde compound (B), and the siloxane compound (C) as converted into a solid content. When the use amount of the organic solvent is 25 parts by mass or more, an insufficiency of the solubility tends to be suppressed. In addition, when the use amount of the organic solvent is not more than 2,000 parts by mass, the reaction time becomes appropriate.

A reaction catalyst can be used for this reaction, if desired. The reaction catalyst which is used is not particularly limited. Examples of the reaction catalyst include acid catalysts such as p-toluenesulfonic acid, etc.; amines such as triethylamine, pyridine, tributylamine, etc.; imidazoles such as methyl imidazole, phenyl imidazole, etc.; phosphorus-based catalysts such as triphenyl phosphine, etc.; and the like. These can be used solely or in admixture of two or more kinds thereof. In order to allow the dehydration condensation reaction to proceed efficiently, for example, an acid catalyst such as p-toluenesulfonic acid, etc. is preferable.

The siloxane compound (i) is obtained by charging the above-described raw materials and organic solvent, and optionally the reaction catalyst into a reactor and conducting the dehydration condensation reaction with stirring for from 0.1 hours to 10 hours while heating and lagging, if desired.

The reaction temperature is, for example, preferably from 70 to 150° C., and it is desirable to conduct the reaction while removing water that is a by-product. The reaction temperature is more preferably from 100 to 130° C. When the temperature is lower than 70° C., the reaction rate becomes slow. When the temperature is not higher than 150° C., a high-boiling point solvent is not necessary for the reaction solvent, and at the time of preparing a prepreg, the residual solvent hardly remains, so that a lowering of the heat resistance can be suppressed.

Next, the Reaction Method b is described in detail. According to the Reaction Method b, first of all, the aromatic amine compound (A) having at least two primary amino groups in one molecule thereof and the aromatic aldehyde compound (B) having at least two aldehyde groups in one molecule thereof are allowed to react with each other to obtain an aromatic azomethine compound having at least one aldehyde group in one molecule thereof. Subsequently, the above-described compound and the siloxane compound (C) having at least two amino groups in a molecular terminal thereof are allowed to react with each other, whereby the modified siloxane compound (ii) having an aromatic azomethine can be obtained.

In the Reaction Method b, as for the organic solvent which is used for the reaction and the reaction catalyst which is optionally used, the same materials as those in the Reaction Method a can be arbitrarily used.

First of all, the aromatic amine compound (A) having at least two primary amino groups in one molecule thereof and the aromatic aldehyde compound (B) having at least two aldehyde groups in one molecule thereof are subjected to a dehydration condensation reaction in an organic solvent to obtain an aromatic azomethine compound having at least one aldehyde group in one molecule thereof.

Here, as for the use amounts of the aromatic amine compound (A) having at least two primary amino groups in one molecule thereof and the aromatic aldehyde compound (B) having at least two aldehyde groups in one molecule thereof, for example, it is preferable to use these compounds such that the number of primary amino groups of the aromatic amine compound (A) [{use amount of the aromatic amine compound (A)}/{primary amino group equivalent of the aromatic amine compound (A)}] is in the range of from 0.1 times to 5.0 times the number of aldehyde groups of the aromatic aldehyde compound (B) [{use amount of the aromatic aldehyde compound (B)}/{aldehyde group equivalent of the aromatic aldehyde compound (B)}]. When the number of primary amino groups is 0.1 times or more, a lowering of the molecular weight of the aromatic azomethine compound obtained by this reaction tends to be suppressed. In addition, when the number of primary amino groups is not more than 5.0 times, a lowering of the solubility in a solvent is suppressed.

In addition, the use amount of the organic solvent is, for example, preferably from 25 to 2,000 parts by mass, more preferably from 40 to 1,000 parts by mass, and especially preferably from 40 to 500 parts by mass based on 100 parts by mass of a total sum of the resin components of the aromatic amine compound (A) and the aromatic aldehyde compound (B). When the use amount of the organic solvent is 25 parts by mass or more, an insufficiency of the solubility tends to be suppressed. In addition, when the use amount of the organic solvent is not more than 2,000 parts by mass, the reaction time becomes appropriate.

The aromatic azomethine compound having at least one aldehyde group in one molecule thereof is obtained by charging the above-described raw materials and organic solvent, and optionally the reaction catalyst into a reactor and conducting the dehydration condensation reaction with stirring for from 0.1 hours to 10 hours while heating and lagging, if desired.

The reaction temperature is, for example, preferably from 70 to 150° C., and more preferably from 100 to 130° C. In addition, it is preferable to conduct the reaction while removing water that is a by-product. When the temperature is 70° C. or higher, there is a tendency that the reaction rate does not become excessively slow. When the reaction temperature is not higher than 150° C., a high-boiling point solvent is not necessary for the reaction solvent, and at the time of preparing a prepreg, the residual solvent hardly remains, so that a lowering of the heat resistance can be suppressed.

Subsequently, the aromatic azomethine compound having at least one aldehyde group in one molecule thereof, which is obtained by the above-described reaction, and the siloxane compound (C) having at least two amino groups in a molecular terminal thereof are subjected to a dehydration condensation reaction in an organic solvent, whereby the modified siloxane compound (ii) having an aromatic azomethine can be obtained.

Here, as for the use amounts of the aromatic azomethine compound and the siloxane compound (C), for example, it is preferable to use these compounds such that the number of primary amino groups of the siloxane compound (C) [{use amount of the siloxane compound (C)}/{primary amino group equivalent of the siloxane compound (C)}] is in the range of from 1.0 to 10.0 times the number of aldehyde groups of the aromatic azomethine compound [(use amount of the aromatic azomethine compound)/(aldehyde group equivalent of the aromatic azomethine compound)]. When the number of primary amino groups is 1.0 time or more, a lowering of the solubility in a solvent tends to be suppressed. In addition, when the number of primary amino groups is not more than 10.0 times, a lowering of the elastic modulus of the thermosetting resin containing the modified siloxane compound (ii) having an aromatic azomethine tends to be suppressed.

In addition, the use amount of the organic solvent is, for example, preferably from 25 to 2,000 parts by mass, more preferably from 40 to 1,000 parts by mass, and especially preferably from 40 to 500 parts by mass based on 100 parts by mass of a total sum of the resin components of the aromatic azomethine compound having at least one aldehyde group in one molecule thereof and the siloxane compound (C). When the use amount of the organic solvent is 25 parts by mass or more, an insufficiency of the solubility tends to be suppressed. In addition, when the use amount of the organic solvent is not more than 2,000 parts by mass, the reaction time becomes appropriate.

The modified siloxane compound (ii) having an aromatic azomethine is obtained by charging the above-described raw materials and organic solvent, and optionally the reaction catalyst into a reactor and conducting the dehydration condensation reaction with stirring for from 0.1 hours to 10 hours while heating and lagging, if desired.

The reaction temperature is, for example, preferably from 70 to 150° C., and more preferably from 100 to 130° C. In addition, it is preferable to conduct the reaction while removing water that is a by-product. When the reaction temperature is 70° C. or higher, there is a tendency that the reaction rate does not become excessively slow. When the reaction temperature is not higher than 150° C., a high-boiling point solvent is not necessary for the reaction solvent, and at the time of preparing a prepreg, the residual solvent hardly remains, so that a lowering of the heat resistance can be suppressed.

Next, the Reaction Method c is described in detail. According to the Reaction Method c, first of all, the aromatic aldehyde compound (B) having at least two aldehyde groups in one molecule thereof and the siloxane compound (C) having at least two amino groups in a molecular terminal thereof are allowed to react with each other to obtain a modified siloxane compound having at least one aldehyde group and an azomethine group (—N=CH—) in one molecule thereof. Subsequently, the above-described compound and the aromatic amine compound (A) having at least two primary amino groups in one molecule thereof are allowed to react with each other, whereby the modified siloxane compound (iii) having an aromatic azomethine can be obtained.

In the Reaction Method c, as for the organic solvent which is used for the reaction and the reaction catalyst which is optionally used, the same materials as those in the Reaction Methods a and b can be arbitrarily used.

The aromatic aldehyde compound (B) having at least two aldehyde groups in one molecule thereof and the siloxane compound (C) having at least two amino groups in a molecular terminal thereof are subjected to a dehydration condensation reaction in an organic solvent to obtain a modified siloxane compound having at least one aldehyde group and an azomethine group (—N=CH—) in one molecule thereof.

Here, as for the use amounts of the aromatic aldehyde compound (B) having at least two aldehyde groups in one molecule thereof and the siloxane compound (C) having at least two amino groups in a molecular terminal thereof, for example, it is preferable to use these compounds such that the number of primary amino groups of the siloxane compound (C) [{use amount of the siloxane compound (C)}/ {primary amino group equivalent of the siloxane compound (C)}] is in the range of from 0.1 times to 5.0 times the number of aldehyde groups of the aromatic aldehyde compound (B) [{use amount of the aromatic aldehyde compound (B)}/ {aldehyde group equivalent of the aromatic aldehyde compound (B)}]. When the number of primary amino groups is 0.1 times or more, a lowering of the solubility in a solvent is suppressed. In addition, when the number of primary amino groups is not more than 5.0 times, a lowering of the molecular weight of the modified siloxane compound having at least one aldehyde group and an azomethine group (—N=CH—) in one molecule thereof, which is obtained by this reaction, is suppressed.

In addition, the use amount of the organic solvent is, for example, preferably from 25 to 2,000 parts by mass, more preferably from 40 to 1,000 parts by mass, and especially preferably from 40 to 500 parts by mass based on 100 parts by mass of a total sum of the resin components of the aromatic aldehyde compound (B) and the siloxane compound (C). When the use amount of the organic solvent is 25 parts by mass or more, the solubility does not become insufficient. In addition, when the use amount of the organic solvent is not more than 2,000 parts by mass, the reaction time becomes appropriate.

The modified siloxane compound having at least one aldehyde group and an azomethine group (—N=CH—) in one molecule thereof is obtained by charging the above-described raw materials and organic solvent, and optionally the reaction catalyst into a reactor and conducting the dehydration condensation reaction with stirring for from 0.1 hours to 10 hours while heating and lagging, if desired.

The reaction temperature is, for example, preferably from 70 to 150° C., and more preferably from 100 to 130° C. In addition, it is preferable to conduct the reaction while removing water that is a by-product. When the reaction temperature is 70° C. or higher, there is a tendency that the reaction rate does not become excessively slow. When the reaction temperature is not higher than 150° C., a high-boiling point solvent is not necessary for the reaction solvent, and at the time of preparing a prepreg, the residual solvent hardly remains, so that a lowering of the heat resistance can be suppressed.

Subsequently, the modified siloxane compound having at least one aldehyde group and an azomethine group (—N=CH—) in one molecule thereof, which is obtained by the above-described reaction, and the aromatic amine compound (A) having at least two primary amino groups in one molecule thereof are subjected to a dehydration condensation reaction in an organic solvent, whereby the modified siloxane compound (iii) having an aromatic azomethine can be obtained.

Here, as for the use amounts of the modified siloxane compound and the aromatic amine compound (A), for example, it is preferable to use these compounds such that the number of primary amino groups of the aromatic amine compound (A) [{use amount of the aromatic amine compound (A)}/{primary amino group equivalent of the aromatic amine compound (A)}] is in the range of from 1.0 to 10.0 times the number of aldehyde groups of the modified siloxane compound [(use amount of the modified siloxane compound)/(aldehyde group equivalent of the modified siloxane compound)]. When the number of primary amino groups is 1.0 time or more, a lowering of the low thermal expansion properties of the thermosetting resin containing the modified siloxane compound (iii) having an aromatic azomethine tends to be suppressed. In addition, when the number of primary amino groups is not more than 10.0 times, a lowering of the solubility in a solvent tends to be suppressed.

In addition, the use amount of the organic solvent is, for example, preferably from 25 to 2,000 parts by mass, more preferably from 40 to 1,000 parts by mass, and especially preferably from 40 to 500 parts by mass based on 100 parts by mass of a total sum of the resin components of the modified siloxane compound having at least one aldehyde group and an azomethine group (—N=CH—) in one molecule thereof and the aromatic amine compound (A). When the use amount of the organic solvent is 25 parts by mass or more, an insufficiency of the solubility tends to be suppressed. In addition, when the use amount of the organic solvent is not more than 2,000 parts by mass, the reaction time becomes appropriate.

The modified siloxane compound (iii) having an aromatic azomethine is obtained by charging the above-described raw materials and organic solvent, and optionally the reaction catalyst into a reactor and conducting the dehydration condensation reaction with stirring for from 0.1 hours to 10 hours while heating and lagging, if desired.

The reaction temperature is, for example, preferably from 70 to 150° C., and more preferably from 100 to 130° C. In addition, it is preferable to conduct the reaction while removing water that is a by-product. When the reaction temperature is 70° C. or higher, there is a tendency that the reaction rate does not become excessively slow. When the reaction temperature is not higher than 150° C., a high-boiling point solvent is not necessary for the reaction solvent, and at the time of preparing a prepreg, the residual solvent hardly remains, so that a lowering of the heat resistance can be suppressed.

The modified siloxane compounds obtained by the above-described Reaction Methods a, b and c can be confirmed by conducting the IR measurement. According to the IR measurement, the appearance of a peak at 1,620 cm$^{-1}$ assigned to an azomethine group (—N=CH—) is confirmed, and the presence of peaks at 3,440 cm$^{-1}$ and 3,370 cm$^{-1}$ assigned to a primary amino group is confirmed, whereby it can be confirmed that the reaction proceeds well to obtain a desired compound. In addition, a weight average molecular weight (Mw) is, for example, preferably from 1,000 to 300,000, and especially preferably 6,000 to 150,000. When the weight average molecular weight (Mw) is the above-described lower limit value or more, the low cure shrinkage and the low thermal expansion properties are enhanced, whereas when it is not more than the above-described upper limit, the compatibility and the elastic modulus are enhanced. Incidentally, the weight average molecular weight (Mw) is one obtained by conducting the measurement by means of gel permeation chromatography (GPC), followed by conversion with a calibration curve prepared by using standard polystyrene. For example, the weight average molecular weight can be determined under the following conditions. As for a measurement apparatus, an auto sampler (AS-8020, manu-factured by Tosoh Corporation), a column oven (860-CO, manufactured by JASCO Corporation), an RI detector (830-RI, manufactured by JASCO Corporation), a UV/VIS detector (870-UV, manufactured by JASCO Corporation), and an HPLC pump (880-PU, manufactured by JASCO Corporation) are used.

In addition, TSKgel Super HZ2000, 2300, manufactured by Tosoh Corporation can be used as the column to be used. As for the measurement conditions, it is possible to conduct the measurement with tetrahydrofuran as a solvent at a measurement temperature of 40° C. and at a flow rate of 0.5 mL/min.

(Modified Imide Resin)

The modified imide resin of the present invention is one obtained by allowing the amino-modified siloxane compound of the present invention as described previously and the maleimide compound (C) having at least two N-substituted maleimide groups in one molecule thereof to react with each other.

Furthermore, the modified imide resin is preferably one having an acidic substituent, the acidic substituent being one derived from an acidic substituent of an amine compound (D) represented by the following general formula (3). The acidic substituent can be introduced through a reaction with the amine compound (D). When the modified imide resin has such an acidic substituent, good low thermal expansion properties can be obtained.

[Chem. 8]

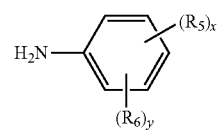

(3)

(In the formula, each $R_1$ independently represents a hydroxyl group, a carboxyl group, or a sulfonic acid group, each of which is an acidic substituent; each $R_2$ independently represents a hydrogen atom, an aliphatic hydrocarbon group having from 1 to 5 carbon atoms, or a halogen atom; x represents an integer of from 1 to 5; and y represents an integer of from 0 to 4, provided that the sum of x and y is 5.)

Incidentally, more details of the amine compound (D) are described later. In addition, the terms "one derived from an acidic substituent of an amine compound (D)" include an acidic substituent of the amine compound (D) itself and a group containing the acidic substituent.

The modified imide resin can be prepared in "pre-reaction" at the time of preparing a thermosetting resin composition as described later.

(Thermosetting Resin Composition)

The thermosetting resin composition of the present invention comprises the modified siloxane compound of the present invention and the maleimide compound (D) having at least two N-substituted maleimide groups in one molecule thereof.

Examples of the maleimide compound (D) having at least two N-substituted maleimide groups in one molecule thereof (hereinafter sometimes referred to as "maleimide compound (D)") include bis(4-maleimidophenyl)methane, polyphenylmethane maleimide, bis(4-maleimidophenyl)ether, bis(4-maleimidophenyl)sulfone, 3,3-dimethyl-5,5-diethyl-4,4-diphenylmethane bismaleimide, 4-methyl-1,3- phenylenebismaleimide, m-phenylenebismaleimide, 2,2-bis (4-(4-maleimidophenoxy)phenyl)propane, and the like. These maleimide compounds may be used solely or in admixture of two or more kinds thereof.

Of these, bis(4-maleimidophenyl)methane, bis(4-maleimidophenyl)sulfone, and 2,2-bis(4-(4-maleimidophenoxy)phenyl)propane are preferable, for example, from the standpoints of high reactivity and enablement to achieve higher heat resistance; and bis(4-maleimidophenyl) methane and 2,2-bis(4-(4-maleimidophenoxy)phenyl)propane are more preferable from the standpoint of solubility in a solvent; and bis(4-maleimidophenyl)methane is especially preferable from the standpoint of inexpensiveness.

In the thermosetting resin composition of the present invention, the use amount (blending amount) of the siloxane compound of the present invention is, for example, preferably from 1 to 30 parts by mass based on 100 parts by mass of a total sum of the resin components, and it is more preferably from 5 to 20 parts by mass from the standpoints of copper foil adhesiveness and chemical resistance.

The use amount of the maleimide compound (D) is, for example, preferably from 30 to 99 parts by mass based on 100 parts by mass of a total sum of the resin components, and it is more preferably from 40 to 95 parts by mass from the standpoints of low thermal expansion properties and high elastic modulus.

The thermosetting resin composition of the present invention comprises the siloxane compound of the present invention and the maleimide compound (D) having at least two N-substituted maleimide groups in one molecule thereof. However, the above-described compounds can also be used as a modified imide resin having an aromatic azomethine upon being subjected to pre-reaction. By conducting such pre-reaction, the molecular weight can be controlled, and the low cure shrinkage and the low thermal expansion properties can be more enhanced.

As for this pre-reaction, it is preferable to synthesize a modified imide resin by allowing the siloxane compound of the present invention and the maleimide compound (D) to react with each other while heating and lagging in an organic solvent.

The reaction temperature at the time of allowing the modified siloxane compound and the maleimide compound (D) to react with each other in an organic solvent is, for example, preferably from 70 to 150° C., and more preferably from 100 to 130° C. The reaction time is, for example, preferably from 0.1 to 10 hours, and more preferably from 1 to 6 hours.

In this pre-reaction, as for the use amounts of the maleimide compound (D) and the siloxane compound of the present invention, for example, the number of maleimide groups of the maleimide compound (D) [{use amount of the maleimide compound (D)}/{maleimide group equivalent of the maleimide compound (D)}] is preferably in the range of from 2.0 to 10.0 times the number of primary amino groups of the siloxane compound of the present invention [(use amount of the siloxane compound of the present invention)/ (primary amino group equivalent of the siloxane compound of the present invention)]. When the number of maleimide groups is 2.0 times or more, lowerings of the gelation and the heat resistance tend to be suppressed. In addition, when the number of maleimide groups is not more 10.0 times, lowerings of the solubility in an organic solvent and the heat resistance tend to be suppressed.

The use amount of the maleimide compound (D) in the pre-reaction is, for example, preferably from 50 to 3,000 parts by mass, and more preferably from 100 to 1,500 parts by mass based on 100 parts by mass of the resin components of the siloxane compound of the present invention while keeping the above-described relationship. When the use amount of the maleimide compound (D) is 50 parts by mass or more, a lowering of the heat resistance tends to be suppressed. In addition, when the amount of the maleimide compound (D) is not more than 3,000 parts by mass, the low thermal expansion properties can be kept well.

Examples of the organic solvent which is used for this pre-reaction include alcohol-based solvents such as ethanol, propanol, butanol, methyl cellosolve, butyl cellosolve, propylene glycol monomethyl ether, etc.; ketone-based solvents such as acetone, methyl ethyl ketone, methyl isobutyl ketone, cyclohexanone, etc.; ester-based solvents such as ethyl acetate, γ-butyrolactone, etc.; ether-based solvents such as tetrahydrofuran, etc.; aromatic solvents such as toluene, xylene, mesitylene, etc.; nitrogen atom-containing solvents such as dimethylformamide, dimethylacetamide, N-methylpyrrolidone, etc.; sulfur atom-containing solvents such as dimethyl sulfoxide, etc.; and the like. These can be used solely or in admixture of two or more kinds thereof.

Of these organic solvents, cyclohexanone, propylene glycol monomethyl ether, methyl cellosolve, and γ-butyrolactone are preferable, for example, from the standpoint of solubility; and cyclohexanone, propylene glycol monomethyl ether, and dimethylacetamide are especially preferable from the standpoints that they have low toxicity and that they have high volatility, so that they hardly remain as a residual solvent.

The use amount of the organic solvent is, for example, preferably from 25 to 2,000 parts by mass, more preferably from 40 to 1,000 parts by mass, and especially preferably from 40 to 500 parts by mass based on 100 parts by mass of a total sum of the resin components of the siloxane compound of the present invention and the maleimide compound (D). When the use amount of the organic solvent is 25 parts by mass or more, the solubility does not become insufficient. In addition, when the use amount of the organic solvent is not more than 2,000 parts by mass, the reaction time becomes appropriate.

In addition, a reaction catalyst can be arbitrarily used for this pre-reaction. Though the reaction catalyst is not particularly limited, examples thereof include amines such as triethylamine, pyridine, tributylamine, etc.; imidazoles such as methyl imidazole, phenyl imidazole, etc.; phosphorus-based catalysts such as triphenyl phosphine, etc.; alkali metal amides such as lithium amide, sodium amide, potassium amide, etc.; and the like. These can be used solely or in admixture of two or more kinds thereof.

In addition, the use amount of the modified imide resin having an aromatic azomethine obtained by the above-described pre-reaction is, for example, preferably from 50 to 100 parts by mass, and more preferably from 60 to 100 parts by mass based on 100 parts by mass of a total sum of the resin components. When the blending amount of the modified imide resin having an aromatic azomethine is 50 parts by mass or more, low thermal expansion properties and high elastic modulus are obtained.

Though the thermosetting resin composition comprising the siloxane compound of the present invention and the maleimide compound (D) having at least two N-substituted maleimide groups in one molecule thereof and the modified imide resin having an aromatic azomethine obtained by subjecting the above-described compounds to pre-reaction have good thermosetting reactivity solely, a curing agent and a radical initiator may be used jointly, if desired. By using the curing agent and the radical initiator, the heat resistance, adhesiveness, and the mechanical strength can be enhanced.

Examples of the curing agent which is used jointly include dicyandiamide; aromatic amines such as 4,4'-diaminodiphenylmethane, 4,4'-diamino-3,3'-diethyl-diphenylmethane, 4,4'-diaminodiphenylsulfone, phenylenediamine, xylenediamine, etc.; aliphatic amines such as hexamethylenediamine, 2,5-dimethylhexamethylenediamine, etc.; guanamine compounds such as melamine, benzoguanamine, etc.; and the like.

In addition, though the above-described radical initiator is not particularly limited, for example, organic peroxides such as an acyl peroxide, a hydroperoxide, a ketone peroxide, an organic peroxide having a t-butyl group, a peroxide having a cumyl group, etc., and the like can be used. These may be used solely or in admixture of two or more kinds thereof. Of these, aromatic amines are preferable, for example, from the standpoint of good reactivity or heat resistance.

Furthermore, the thermosetting resin composition of the present invention can contain an amine compound (E) having an acidic substituent, which is represented by the following general formula (3).

[Chem. 9]

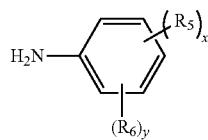

(3)

(In the formula, each $R_5$ independently represents a hydroxyl group, a carboxyl group, or a sulfonic acid group, each of which is an acidic substituent; each $R_6$ independently represents a hydrogen atom, an aliphatic hydrocarbon group having from 1 to 5 carbon atoms, or a halogen atom; x represents an integer of from 1 to 5; and y represents an integer of from 0 to 4, provided that the sum of x and y is 5.)

Examples of the amine compound (E) having an acidic substituent include m-aminophenol, p-aminophenol, o-aminophenol, p-aminobenzoic acid, m-aminobenzoic acid, o-aminobenzoic acid, o-aminobenzenesulfonic acid, m-aminobenzenesulfonic acid, p-aminobenzenesulfonic acid, 3,5-dihydroxyaniline, 3,5-dicarboxyaniline, and the like. Of these, m-aminophenol, p-aminophenol, o-aminophenol, p-aminobenzoic acid, m-aminobenzoic acid, and 3,5-dihydroxyaniline are preferable, for example, from the standpoint of solubility or yield of the synthesis; and m-aminophenol and p-aminophenol are more preferable from the standpoint of heat resistance.

The use amount of the amine compound (E) having an acidic substituent is, for example, preferably from 0.5 to 30 parts by mass based on 100 parts by mass of a total sum of the resin components, and it is more preferably from 1 to 20 parts by mass from the standpoint of low thermal expansion properties.

The thermosetting resin composition of the present invention may contain the modified siloxane compound of the present invention, the maleimide compound (D) having at least two N-substituted maleimide groups in one molecule thereof, and the amine compound (E) having an acidic substituent, or may be used as a modified imide resin having an acidic substituent and an aromatic azomethine by subjecting the above-described compounds to pre-reaction. By conducting such pre-reaction, the molecular weight can be controlled, and the low cure shrinkage and the low thermal expansion properties can be more enhanced.

As for this pre-reaction, it is preferable to synthesize the modified imide resin having an acidic substituent by allowing the siloxane compound of the present invention, the maleimide compound (D), and the amine compound (E) having an acidic substituent to react with each other while heating and lagging in an organic solvent.

The reaction temperature at the time of allowing the siloxane compound of the present invention, the maleimide compound (D), and the amine compound (E) having an acidic substituent to react with each other in an organic solvent is, for example, preferably from 70 to 150° C., and more preferably 100 to 130° C. The reaction time is, for example, preferably from 0.1 to 10 hours, and more preferably from 1 to 6 hours.

In this pre-reaction, as for the use amounts of the maleimide compound (D), the siloxane compound of the present invention, and the amine compound (E) having an acidic substituent, for example, the number of maleimide groups of the maleimide compound (D) [{use amount of the maleimide compound (D)}/{maleimide group equivalent of the maleimide compound (D)}] is preferably in the range of from 2.0 to 10.0 times the number of primary amino groups of the siloxane compound of the present invention and the amine compound (E) having an acidic substituent [(use amount of the siloxane compound of the present invention)/ {(primary amino group equivalent of the siloxane compound of the present invention)+(use amount of the amine compound (E) having an acidic substituent)}/{primary amino group equivalent of the amine compound (E) having an acidic substituent}]. When the number of maleimide groups is 2.0 times or more, lowerings of the gelation and the heat resistance tend to be suppressed. In addition, when the number of maleimide groups is not more than 10.0 times, lowerings of the solubility in an organic solvent and the heat resistance can be suppressed.

The use amount of the maleimide compound (D) in the pre-reaction is, for example, preferably from 50 to 3,000 parts by mass, and more preferably from 100 to 1,500 parts by mass based on 100 parts by mass of the resin components of the siloxane compound of the present invention while keeping the above-described relationship. When the use amount of the maleimide compound (D) is 50 parts by mass or more, a lowering of the heat resistance can be suppressed. In addition, when the amount of the maleimide compound (D) is not more than 3,000 parts by mass, the low thermal expansion properties can be kept well.

In addition, the use amount of the amine compound (E) having an acidic substituent in the pre-reaction is, for example, preferably from 1 to 1,000 parts by mass, and more preferably from 5 to 500 parts by mass based on 100 parts by mass of the resin components of the siloxane compound of the present invention. When the use amount of the amine compound (E) is 1 part by mass or more, it is possible to suppress a lowering of the heat resistance. In addition, when the use amount of the amine compound (E) is not more than 1,000 parts by masse, the low thermal expansion properties can be kept well.

Though the organic solvent which is used for this pre-reaction is not particularly limited, examples thereof include alcohol-based solvents such as ethanol, propanol, butanol, methyl cellosolve, butyl cellosolve, propylene glycol monomethyl ether, etc.; ketone-based solvents such as acetone, methyl ethyl ketone, methyl isobutyl ketone, cyclohexanone, etc.; ester-based solvents such as ethyl acetate, γ-butyrolactone, etc.; ether-based solvents such as tetrahydrofuran, etc.; aromatic solvents such as toluene, xylene, mesitylene, etc.; nitrogen atom-containing solvents such as dimethylformamide, dimethylacetamide, N-methylpyrrolidone, etc.; sulfur atom-containing solvents such as dimethyl sulfoxide, etc.; and the like. These can be used solely or in admixture of two or more kinds thereof.

Of these organic solvents, cyclohexanone, propylene glycol monomethyl ether, methyl cellosolve, and γ-butyrolactone are preferable, for example, from the standpoint of solubility; and cyclohexanone, propylene glycol monomethyl ether, and dimethylacetamide are especially preferable from the standpoints that they have low toxicity and that they have high volatility, so that they hardly remain as a residual solvent.

The use amount of the organic solvent is, for example, preferably from 25 to 2,000 parts by mass, more preferably from 40 to 1,000 parts by mass, and especially preferably from 40 to 500 parts by mass based on 100 parts by mass of a total sum of the resin components of the siloxane compound of the present invention, the maleimide compound (D), and the amine compound (E) having an acidic substituent. When the use amount of the organic solvent is 25 parts by mass or more, an insufficiency of the solubility tends to be suppressed. In addition, when the use amount of the organic solvent is not more than 2,000 parts by mass, the reaction time becomes appropriate.

In addition, a reaction catalyst can be arbitrarily used for this pre-reaction. Though the reaction catalyst is not particularly limited, examples thereof include amines such as triethylamine, pyridine, tributylamine, etc.; imidazoles such as methyl imidazole, phenyl imidazole, etc.; phosphorus-based catalysts such as triphenyl phosphine, etc.; alkali metal amides such as lithium amide, sodium amide, potassium amide, etc.; and the like. These can be used solely or in admixture of two or more kinds thereof.

In addition, the use amount of the modified imide resin having an acidic substituent and an aromatic azomethine obtained by the above-described pre-reaction is, for example, preferably from 50 to 100 parts by mass, and more preferably from 60 to 100 parts by mass based on 100 parts by mass of a total sum of the resin components. When the blending amount of the modified imide resin having an acidic substituent and an aromatic azomethine is 50 parts by mass or more, low thermal expansion properties and high elastic modulus are obtained.

Though the thermosetting resin composition comprising the modified siloxane compound having an aromatic azomethine of the present invention, the maleimide compound (D) having at least two N-substituted maleimide groups in one molecule thereof, and the amine compound (E) having an acidic substituent and the modified imide resin having an acidic substituent and an aromatic azomethine obtained by subjecting the above-described compounds to pre-reaction have good thermosetting reactivity solely, a curing agent and a radical initiator may be used jointly, if desired. By using the curing agent and the radical initiator, the heat resistance, adhesiveness, and the mechanical strength can be enhanced.

Examples of the curing agent which is used jointly include dicyandiamide; aromatic amines such as 4,4'-diaminodiphenylmethane, 4,4'-diamino-3,3'-diethyl-diphenylmethane, 4,4'-diaminodiphenylsulfone, phenylenediamine, xylenediamine, etc.; aliphatic amines such as hexamethylenediamine, 2,5-dimethylhexamethylenediamine, etc.; guanamine compounds such as melamine, benzoguanamine, etc.; and the like.

In addition, as the above-described radical initiator, for example, organic peroxides such as an acyl peroxide, a hydroperoxide, a ketone peroxide, an organic peroxide having a t-butyl group, a peroxide having a cumyl group, etc., and the like can be used. These may be used solely or in admixture of two or more kinds thereof. Of these, aromatic amines are preferable, for example, from the standpoint of good reactivity or heat resistance.

Furthermore, the thermosetting resin composition of the present invention can contain a thermoplastic elastomer (F).

Examples of the thermoplastic elastomer (F) include styrene-based elastomers, olefin-based elastomers, urethane-based elastomers, polyester-based elastomers, polyamide-based elastomers, acrylic elastomers, silicone-based elastomers, and derivatives thereof. These contain a hard segment component and a soft segment component, and in general, the former contributes to the heat resistance and the strength, and the latter contributes to the flexibility and the toughness. These can be used solely or in admixture of two or more kinds thereof.

In addition, as such an elastomer, one having a reactive functional group in a molecular terminal or molecular chain thereof can be used. Examples of the reactive functional group include an epoxy group, a hydroxyl group, a carboxyl group, an amino group, an amide group, an isocyanate group, an acryl group, a methacryl group, a vinyl group, and the like. In view of the fact that the elastomer has such a reactive functional group in a molecular terminal or molecular chain thereof, the compatibility with the resin is enhanced, and an internal stress generated at the time of curing of the thermosetting resin composition of the present invention can be effectively decreased. As a result, it becomes possible to remarkably decrease a warp of the board.

Of these elastomers, styrene-based elastomers, olefin-based elastomers, polyamide-based elastomers, and silicone-based elastomers are preferable, for example, from the standpoints of heat resistance and electrical insulation reliability; and styrene-based elastomers and olefin-based elastomers are especially preferable from the standpoint of dielectric properties.

In addition, as for the reactive functional group which such an elastomer has in a molecular terminal or molecular chain thereof, an epoxy group, a hydroxyl group, a carboxyl group, an amino group, and an amide group are preferable, for example, from the standpoint of adhesion to a metal foil; and an epoxy resin, a hydroxyl group, and an amino group are especially preferable from the standpoints of heat resistance and electrical insulation reliability.

The use amount of the thermoplastic elastomer (F) is, for example, preferably from 0.1 to 50 parts by mass based on 100 parts by mass of a total sum of the resin components, and it is more preferably from 2 to 30 parts by mass from the standpoints of good compatibility of the resin and effective revelation of low cure shrinkage, low thermal expansion properties, and excellent dielectric properties of a cured product.

Furthermore, the thermosetting resin composition of the present invention can contain at least one thermosetting resin (G) selected from an epoxy resin and a cyanate resin.

Examples of the epoxy resin include a bisphenol A type epoxy resin, a bisphenol F type epoxy resin, a bisphenol S type epoxy resin, a phenol novolac type epoxy resin, a cresol novolac type epoxy resin, a bisphenol A novolac type epoxy resin, a bisphenol F novolac type epoxy resin, a stilbene type epoxy resin, a triazine skeleton-containing epoxy resin, a fluorene skeleton-containing epoxy resin, a triphenolphenolmethane type epoxy resin, a biphenyl type epoxy resin, a xylylene type epoxy resin, a biphenyl aralkyl type epoxy resin, a naphthalene type epoxy resin, a dicyclopentadiene type epoxy resin, an alicyclic epoxy resin, a diglycidyl ether compound of a polyfunctional phenol or a polycyclic aromatic compound such as anthracene, etc., a phosphorus-containing epoxy resin obtained by introducing a phosphorus compound to these resins, and the like. These may be used solely or in admixture of two or more kinds thereof. Of these, a biphenyl aralkyl type epoxy resin and a naphthalene type epoxy resin are preferable, for example, from the standpoints of heat resistance and flame retardancy.

In addition, examples of the cyanate resin include a novolac type cyanate resin, a bisphenol type cyanate resin such as a bisphenol A type cyanate resin, a bisphenol E type cyanate resin, a tetramethyl bisphenol F type cyanate resin, etc., a prepolymer obtained by converting a part of such a resin into triazine, and the like. These may be used solely or in admixture of two or more kinds thereof. Of these, a novolac type cyanate resin is preferable, for example, from the standpoints of heat resistance and flame retardancy.

A curing agent can be used for such a thermosetting resin (G), if desired. Examples of the curing agent include polyfunctional phenol compounds such as a phenol novolac resin, a cresol novolac resin, an aminotriazine novolac resin, etc.; amine compounds such as dicyandiamide, diaminodiphenylmethane, diaminodiphenylsulfone, etc.; acid anhydrides such as phthalic anhydride, pyromellitic anhydride, maleic anhydride, a maleic anhydride copolymer, etc.; and the like. These can be used solely or in admixture of two or more kinds thereof.

The use amount of the thermosetting resin (G) is, for example, preferably from 1 to 50 parts by mass based on 100 parts by mass of a total sum of the resin components, and it is more preferable from 3 to 30 parts by mass from the standpoints of heat resistance and chemical resistance.

The thermosetting resin composition of the present invention can contain an inorganic filler (H). Examples of the inorganic filler include silica, alumina, talc, mica, kaolin, aluminum hydroxide, boehmite, magnesium hydroxide, zinc borate, zinc stannate, zinc oxide, titanium oxide, boron nitride, calcium carbonate, barium sulfate, aluminum borate, potassium titanate, glass powders or hollow glass beads of E-glass, T-glass, D-glass, etc., and the like. These may be used solely or in admixture of two or more kinds thereof.

Of these inorganic fillers, silica is especially preferable, for example, from the standpoints of dielectric properties, heat resistance, and low thermal expansion properties. Examples of the silica include precipitated silica with a high water content, which is prepared by a wet process; and dry process silica not substantially containing bonding water or the like, which is prepared by a dry process. Furthermore, examples of the dry process silica include crushed silica, fumed silica, fused spherical silica, and the like, according to a difference in the preparation method. Of these, fused spherical silica is preferable from the standpoints of low thermal expansion properties and high fluidity at the time of filling in the resin.

In the case of using fused spherical silica as the inorganic filler, for example, an average particle diameter thereof is preferably from 0.1 to 10 μm, and more preferably from 0.3 to 8 μm. When the average particle diameter of the fused spherical silica is 0.1 μm or more, the fluidity at the time of highly filling in the resin can be kept well. Furthermore, when the average particle diameter of the fused spherical silica is not more than 10 μm, the probability of incorporation of coarse particles is decreased, whereby the generation of failure caused by coarse particles can be controlled. Here, the average particle diameter refers to a particle diameter at a point corresponding to 50% of the volume at the time of determining a cumulative distribution curve by the particle diameter while defining a total volume of particles as 100%. The average particle diameter can be measured by a particle size distribution analyzer adopting a laser diffraction scattering method, or the like.

The content of the inorganic filler is, for example, preferably from 20 to 500 parts by mass, and more preferably from 50 to 350 parts by mass based on 100 parts by mass of a total sum of the resin components. When the content of the inorganic filler is from 20 to 500 parts by mass based on 100 parts by mass of a total sum of the resin components, the moldability and low thermal expansion properties of the resin composition can be kept well.

In addition, at the time of blending the inorganic filler in the resin composition, for example, it is also preferable to subject the inorganic filler to a pretreatment or integral blending treatment with a silane-based or titanate-based coupling agent, or other coupling agent, or a surface treating agent such as a silicone oligomer, etc.

The thermosetting resin composition of the present invention can contain a curing accelerator (I). Examples of the curing accelerator include organic metal salts such as zinc naphthenate, cobalt naphthenate, tin octylate, cobalt octylate, cobalt(II) bisacetylacetonate, cobalt(III) triacetylacetonate, etc.; imidazoles and derivatives thereof; organic phosphorus-based compounds such as phosphines, phosphonium salts, etc.; secondary amines; tertiary amines; quaternary ammonium salts; and the like. These can be used solely or in admixture of two or more kinds thereof.

Of these, zinc naphthenate, imidazole derivatives, and phosphonium salts are preferable, for example, from the standpoints of accelerating effect and storage stability.

The content of the curing accelerator is, for example, preferably from 0.01 to 3.0 parts by mass, and more preferably from 0.05 to 1.5 parts by mass based on 100 parts by mass of a total sum of the resin components. When the content of the curing accelerator is from 0.01 to 3.0 parts by mass based on 100 parts by mass of a total sum of the resin components, the accelerating effect and storage stability can be kept well.

In the present invention, so long as its object is not violated, a known thermoplastic resin, organic filler, flame retarder, ultraviolet light absorber, antioxidant, photopolymerization initiator, fluorescent brightener, or adhesion improver, or the like can be arbitrarily used. These can be used solely or in admixture of two or more kinds thereof.

Examples of the thermoplastic resin include a polyphenylene ether resin, a phenoxy resin, a polycarbonate resin, a polyester resin, a polyamide resin, a polyimide resin, a xylene resin, a petroleum resin, a silicone resin, and the like.

Examples of the organic filler include a resin filler composed of polyethylene, polypropylene, polystyrene, a polyphenylene ether resin, a silicone resin, a tetrafluoroethylene resin, or the like; a resin filler having a core/shell structure having a core layer in a rubber state, which is composed of an acrylic acid ester-based resin, a methacrylic acid ester-based resin, a conjugated diene-based resin, or the like, and a shell layer in a glass state, which is composed of an acrylic acid ester-based resin, a methacrylic acid ester-based resin, an aromatic vinyl-based resin, a vinyl cyanide-based resin, or the like; and the like.

Examples of the flame retarder include a halogen-containing flame retarder containing bromine or chlorine; a phosphorus-based flame retarder such as triphenyl phosphate, tricresyl phosphate, trisdichloropropyl phosphate, a phosphoric acid ester-based compound, red phosphorus, etc.; a nitrogen-based flame retarder such as guanidine sulfamate, melamine sulfate, melamine polyphosphate, melamine cyanurate, etc.; a phosphazene-based flame retarder such as cyclophosphazene, polyphosphazene, etc.; an inorganic flame retarder such as antimony trioxide, etc.; and the like.

Besides, examples of the ultraviolet light absorber include a benzotriazole-based ultraviolet light absorber; examples of the antioxidant include a hindered phenol-based or hindered amine-based antioxidant; examples of the photopolymerization initiator include a benzophenone, a benzyl ketal, and a thioxanthone-based photopolymerization initiator; examples of the fluorescent brightener include a fluorescent brightener of a stilbene derivative; and examples of the adhesion improver include a urea compound such as urea silane, etc., a silane-based, titanate-based, or aluminate-based coupling agent, or other coupling agent, and the like.

Since the thermosetting resin composition containing the siloxane compound of the present invention is used for a prepreg, it is preferable that the thermosetting resin composition is finally made in a varnish state where the respective components are dissolved or dispersed in an organic solvent.

Examples of the organic solvent which is used on that occasion include alcohol-based solvents such as methanol, ethanol, propanol, butanol, methyl cellosolve, butyl cellosolve, propylene glycol monomethyl ether, etc.; ketone-based solvents such as acetone, methyl ethyl ketone, methyl isobutyl ketone, cyclohexanone, etc.; ester-based solvents such as butyl acetate, propylene glycol monomethyl ether acetate, etc.; ether-based solvents such as tetrahydrofuran, etc.; aromatic solvents such as toluene, xylene, mesitylene, etc.; nitrogen atom-containing solvents such as dimethylformamide, dimethylacetamide, N-methylpyrrolidone, etc.; sulfur atom-containing solvents such as dimethyl sulfoxide, etc.; and the like. These can be used solely or in admixture of two or more kinds thereof.

Of these, methyl ethyl ketone, methyl isobutyl ketone, cyclohexanone, methyl cellosolve, and propylene glycol monomethyl ether are preferable, for example, from the standpoint of solubility; and methyl isobutyl ketone, cyclohexanone, and propylene glycol monomethyl ether are more preferable from the standpoint of low toxicity.

The content of the resin components in the finally obtained varnish is, for example, preferably from 40 to 90% by mass, and more preferably from 50 to 80% by mass in the whole of the varnish. When the content of the resin components in the varnish is from 40 to 90% by mass, the coating properties are kept well, whereby a prepreg to which an appropriate amount of the resin components is attached can be obtained.

Here, the "resin components" as referred to in the present specification refer to the siloxane compound, the modified imide resin (inclusive of the modified imide resin having an acidic substituent derived from the acidic substituent of the amine compound (D) represented by the general formula (3) as described previously), the maleimide compound (C), the amine compound (D) having an acidic substituent, the thermoplastic elastomer (E), the thermosetting resin (F), and the reaction product thereof. In addition, the "thermosetting resin composition" refers to one containing the inorganic filler, the curing accelerator, and the like in the above-described resin components.

(Prepreg)

The prepreg of the present invention is one comprising a base material impregnated with the above-described thermosetting resin composition of the present invention. The prepreg of the present invention is hereunder described in detail.

The prepreg of the present invention can be prepared by impregnating a base material with the thermosetting resin composition of the present invention, followed by semi-curing (B-staging) by heating or the like. Though the method of impregnating a base material with the thermosetting resin composition of the present invention is not particularly limited, examples thereof include a method of dipping the base material in the resin varnish; a method of coating the base material with the resin varnish by a coater of every kind; a method of blowing the resin varnish onto the base material by means of spraying; and the like. Of these, a method of dipping the base material in the resin varnish is preferable. According to this, the impregnating properties of the resin composition against the base material can be enhanced.

As the base material of the present invention, well-known base materials used for various laminated plates for electrical insulating material can be used. Examples of a material thereof include inorganic fibers such as E-glass, D-glass, S-glass, Q-glass, etc.; organic fibers such as a polyimide, a polyester, polytetrafluoroethylene, etc.; mixtures thereof; and the like. For other applications, for example, so far as a fiber-reinforcing base material is concerned, it is also possible to use a carbon fiber or the like.

These base materials have a shape of, for example, a woven fabric, a nonwoven fabric, a roving, a chopped strand mat, or a surfacing mat. The material and the shape are selected according to the application or performance of a desired molded product and can be used solely or in admixture of two or more kinds of the material and shape, if desired. As for thickness of the base material, for example, a base material having a thickness of from about 0.03 to 0.5 mm can be used. A base material formed by a surface treatment with a silane coupling agent or the like, or formed by a mechanical opening treatment is suitable from the standpoint of heat resistance, moisture resistance, or workability.

The prepreg of the present invention can be, for example, obtained by impregnating or coating the base material with the thermosetting resin composition such that an amount of the thermosetting resin composition attached to the base material is from 20 to 90% by mass in terms of a content of the thermosetting resin composition of the prepreg after drying, and then usually heating for drying at a temperature of from 100 to 200° C. for from 1 to 30 minutes, thereby achieving semi-curing (B-staging).

(Film with Resin)

The film with resin of the present invention is one comprising a support subjected to layer forming with the thermosetting resin composition of the present invention. Though a method of subjecting a support to layer forming with the thermosetting resin composition obtained in the present invention is not particularly limited, for example, the thermosetting resin composition obtained in the present invention is made in a state of a varnish, coated on the support by using a coater of every kind, and further dried by means of heating, blowing of hot air, or the like, whereby a resin composition layer can be formed. In this way, the film with resin of the present invention can be prepared by semi-curing (B-staging) by means of heating or the like. This semi-cured state is preferably a state where at the time of laminating the film with resin and a circuit board and curing them, an adhesive force between the resin composition layer of the film with resin and the circuit board is ensured, and embedding properties (fluidity) into the circuit board are also ensured.

Though the coater which is used at the time of coating the thermosetting resin composition of the present invention on the support is not particularly limited, for example, a die coater, a comma coater, a bar coater, a kiss coater, a roll coater, and the like can be utilized. These can be properly selected according to the thickness of the resin composition layer. In addition, as for the drying method, heating, blowing of hot air, or the like can be adopted.

As for drying conditions after coating the thermosetting resin composition on the support, for example, drying is conducted such that the content of the organic solvent for the resin composition layer is usually not more than 10% by mass, and preferably not more than 5% by mass. Though the drying conditions vary with the amount of the organic solvent in the varnish and a boiling point of the organic solvent, for example, the resin composition layer is formed by drying the varnish containing from 30 to 60% by mass of the organic solvent at from 50 to 150° C. for from about 3 to 10 minutes. As for the drying conditions, it is preferable to properly set suitable drying conditions through a simple experiment in advance.

A thickness of the resin composition layer which is formed on the support is usually a thickness of a conductor layer which the circuit board has or more. The thickness of the conductor layer is, for example, preferably from 5 to 70 μm. For the purpose of achieving reduction in weight and size of the multilayer printed wiring board, the thickness of the conductor layer is more preferably from 5 to 50 μm, and still more preferably from 5 to 30 μm.

Examples of the support in the film with resin include a film composed of a polyolefin such as polyethylene, polypropylene, polyvinyl chloride, etc., a polyester such as polyethylene terephthalate (hereinafter sometimes abbreviated as "PET"), polyethylene naphthalate, etc., a polycarbonate, a polyimide, or the like; release paper; and a metal foil such a copper foil, an aluminum foil, etc. Incidentally, the support and a protective film as described later may be subjected to a release treatment, in addition to a mat treatment or a corona treatment.

The thickness of the support is, for example, preferably from 10 to 150 μm, and more preferably from 25 to 50 μm. A protective film according to the support can be further laminated on the surface of the resin composition layer, on which the support is not provided. The thickness of the protective film is, for example, from 1 to 40 μm. By laminating the protective film, incorporation of foreign matters can be prevented from occurring.

The film with resin can also be stored upon being wound up in a roll state.

(Laminated Plate)

The laminated plate of the present invention is one obtained by subjecting the above-described film with resin to laminate molding. For example, the laminated plate can be prepared by laminating the film with resin on one or both surfaces of a circuit board, a prepreg, a base material, or the like by using a vacuum laminator, followed by curing by heating, if desired. Examples of the board which is used for the circuit board include a glass epoxy board, a metal board, a polyester board, a polyimide board, a BT resin board, a thermosetting polyphenylene ether board, and the like. Incidentally, the "circuit board" as referred to herein refers to one in which a circuit pattern is formed on one or both surfaces of the board as described above. In addition, in the printed wiring board in which a conductor layer and an insulating layer are laminated alternately and plurally, one in which a circuit pattern is formed on one or both surfaces of an outermost layer of the printed wiring board is also included in the circuit board as referred to herein. Incidentally, the surface of the conductor layer may be previously subjected to a roughening treatment by means of a blackening treatment or the like.

In the above-described lamination, in the case where the film with resin has a protective film, after removing the protective film, the film with resin and the circuit board are preheated, if desired, and the film with resin is subjected to contact bonding onto the circuit board while pressurizing and heating. In the insulating film with support of the present invention, a method of laminating it onto the circuit board under reduced pressure by a vacuum lamination process is suitably adopted. As for the lamination conditions, for example, it is preferable to conduct the lamination at a contact bonding temperature (lamination temperature) of preferably from 70 to 140° C. and at a contact bonding pressure of preferably from 0.1 to 1.1 MPa under a reduced pressure of not more than 20 mmHg (26.7 hPa) in terms of an air pressure. In addition, the method of lamination may be either a batchwise mode or a continuous mode with rolls.

In the case where after laminating the film with resin on the circuit board, the resultant is cooled to the vicinity of room temperature, followed by releasing the support in the case where the support is released, and the resultant is thermally cured, whereby the insulating resin layer can be formed on the circuit board. Though the thermal curing conditions may be properly selected according to the kinds and contents of the resin components in the resin composition, and the like, they are selected within the range at preferably from 150° C. to 220° C. for from 20 minutes to 180 minutes, and more preferably from 160° C. to 200° C. for from 30 to 120 minutes.

In the case where after forming the insulating resin layer, the support has not been released before curing, the support is released here. Subsequently, if desired, boring is conducted on the insulating layer formed on the circuit board, thereby forming a via hole or a through-hole. The boring can be, for example, conducted by a known method with a drill, laser, plasma, or the like, or a combination of such a method, if desired. Boring with laser such as carbon dioxide laser, YAG laser, etc. is the most general method.

Subsequently, a conductor layer is formed on the insulating resin layer by means of dry plating or wet plating. For the dry plating, a known method such as vapor deposition, sputtering, ion plating, etc. can be adopted. In the case of wet plating, first of all, the surface of the cured insulating resin composition layer is subjected to a roughening treatment with an oxidizing agent such as a permanganic acid salt (e.g., potassium permanganate, sodium permanganate, etc.), a bichromic acid salt, ozone, hydrogen peroxide/sulfuric acid, nitric acid, etc., thereby forming an uneven anchor. In particular, a sodium hydroxide aqueous solution of potassium permanganate, sodium permanganate, or the like (alkaline permanganic acid aqueous solution) is preferably used as the oxidizing agent. Subsequently, the conductor layer is formed by a combined method of electroless plating and electroplating. In addition, the conductor layer can also be formed by forming a plated resist with a reverse pattern to the conductor layer and conducting only electroless plating. As a subsequent pattern forming method, for example, a known subtractive process or semi-additive process or the like can be adopted.

The laminated plate of the present invention is one obtained by subjecting the above-described prepreg of the present invention to laminate molding. The laminated plate can be, for example, prepared by means of laminate molding in a constitution in which from 1 to 20 sheets of the prepreg of the present invention are superimposed, and a metal foil made of copper or aluminum, or the like is disposed on one or both surfaces thereof.

As for molding conditions at the time of preparing the laminated plate, for example, techniques of a laminated plate for electrical insulating material and a multilayer plate can be applied. For example, the molding can be conducted at a temperature of from 100 to 250° C. and at a pressure of from 0.2 to 10 MPa for a heating time in the range of from 0.1 to 5 hours by using a multi-stage press, a multi-stage vacuum press, a continuous molding machine, an autoclave molding machine, or the like. In addition, the laminated plate can also be prepared by combining the prepreg of the present invention with a wiring board for inner layer, followed by conducting laminate molding.

(Multilayer Printed Wiring Board)

The multilayer printed wiring board of the present invention is prepared using the above-described laminated plate. For example, a circuit board can be obtained by subjecting the conductor layer of the laminated plate of the present invention to wiring processing by a usual etching method. Then, a plural number of the laminated plates having been subjected to wiring processing are laminated via the above-described prepreg and then subjected to heat press processing, thereby collectively achieving multilayering. Thereafter, the multilayer printed wiring board can be prepared through formation of a through-hole or a blind via hole by means of drill processing or laser processing and formation of an interlayer wiring by means of plating or with an electrically conductive paste.

(Semiconductor Package)

The semiconductor package of the present invention is one comprising a semiconductor device mounted on the above-described multilayer printed wiring board. The semiconductor package of the present invention is prepared by mounting a semiconductor device such as a semiconductor chip, a memory, etc. at a prescribed position of the above-described printed wiring board.

EXAMPLES

Next, the present invention is hereunder described in more detail by reference to the following Examples, but it should not be construed that the present invention is limited to these Examples.

Incidentally, a resin plate obtained in each of the Examples and Comparative Examples was used to measure and evaluate a cure shrinkage, and a copper clad laminated plate obtained in each of the Examples and Comparative Examples was used to measure and evaluate a glass transition temperature, a coefficient of thermal expansion, copper foil adhesiveness, copper-stuck solder heat resistance, a bending elastic modulus, and dielectric properties by the following methods, respectively.

(1) Measurement of Cure Shrinkage of Resin Plate:

A 5-mm square resin plate (thickness: 1 mm) was fabricated and subjected to thermomechanical analysis using a TMA test apparatus (Q400, manufactured by TA Instruments) by a compression method. After installing the resin plate in the above-described apparatus in the Z-direction, the resin plate was measured by a temperature profile with a temperature rise rate of 45° C./min of 20° C. (kept for 5 minutes)→260° C. (kept for 2 minutes)→20° C. (kept for 5 minutes) at a load of 5 g. The cure shrinkage of the resin plate was evaluated from an initial dimension and an amount of dimensional change between a dimension at 20° C. before starting the temperature rise and a dimension at 20° C. after the temperature rise in the resin plate.

Specifically, the cure shrinkage of the resin plate was calculated according to the following equation.

Cure shrinkage (%)=[{Dimension at 20° C. before starting the temperature rise (mm)}−{Dimension at 20° C. after the temperature rise (mm)}/{Dimension at 20° C. before starting the temperature rise (mm)}]×100

(2) Measurement of Glass Transition Temperature (Tg):

A copper clad laminated plate was dipped in a copper etching liquid to remove a copper foil, thereby fabricating a 5-mm square evaluation board, which was then subjected to thermomechanical analysis using a TMA test apparatus (Q400, manufactured by TA Instruments) by a compression method. After installing the evaluation board in the above-described apparatus in the Z-direction, the measurement was conducted continuously twice under measurement conditions at a load of 5 g and at a temperature rise rate of 10° C./min. Tg indicated at an intersection point of different tangents of a thermal expansion curve in the second measurement was determined to evaluate the heat resistance.

(3) Measurement of Coefficient of Thermal Expansion:

A copper clad laminated plate was dipped in a copper etching liquid to remove a copper foil, thereby fabricating a 5-mm square evaluation board, which was then subjected to thermomechanical analysis using a TMA test apparatus (Q400, manufactured by TA Instruments) by a compression method. After installing the evaluation board in the above-described apparatus in the Z-direction, the measurement was conducted continuously twice under measurement conditions at a load of 5 g and at a temperature rise rate of 10° C./min. An average coefficient of thermal expansion at from 30° C. to 100° C. in the second measurement was calculated and defined as the coefficient of thermal expansion.

(4) Evaluation of Copper Foil Adhesiveness (Copper Foil Peel Strength):

A copper clad laminated plate was dipped in a copper etching liquid to form a 3 mm-wide copper foil to fabricate an evaluation board, and the adhesiveness (peel strength) of the copper foil was measured by using a tensile tester.

(5) Evaluation of Copper-Stuck Solder Heat Resistance:

A 25-mm square evaluation board was fabricated from a copper clad laminated plate and floated in a solder bath at a temperature of 288° C. for 120 minutes. The appearance of the resulting evaluation board was observed to evaluate the copper-stuck solder heat resistance.

(6) Bending Elastic Modulus:

A copper clad laminated plate was dipped in a copper etching liquid to remove a copper foil, thereby fabricating an evaluation board of 25 mm×50 mm. The bending elastic modulus of the evaluation board was measured at a crosshead speed of 1 mm/min and at a span distance of 20 mm by using a 5-ton tensilon, manufactured by Orientec Co., Ltd.

(7) Dielectric Properties (Dielectric Constant and Dielectric Tangent):

A copper clad laminated plate was dipped in a copper etching liquid to remove a copper foil, thereby fabricating an evaluation board of 100 mm×2 mm. The dielectric constant and the dielectric tangent of the evaluation board were measured at a frequency of 1 GHz by using a cavity resonator apparatus (manufactured by Kanto Electronic Application and Development Inc.).

Preparation Example 1

Preparation of Siloxane Compound (i-1)

In a 2 liter volume heatable and coolable reactor equipped with a water determination device with a thermometer, a stirrer, and a reflux cooling tube, 0.27 g of 3,3'-dimethyl-4,4'-diaminobiphenyl, 0.33 g of terephthalaldehyde, 199.4 g of X-22-161B, and 300.0 g of propylene glycol monomethyl ether were charged and allowed to react with each other at 115° C. for 4 hours. Thereafter, the temperature was raised to 130° C., and the resultant was dehydrated by means of atmospheric pressure concentration, thereby obtaining a solution containing a modified siloxane compound (i-1) having an aromatic azomethine (Mw: 30,000, resin components: 90% by mass).

Preparation Example 2

Preparation of Siloxane Compound (i-2)

In a 2 liter volume heatable and coolable reactor equipped with a water determination device with a thermometer, a stirrer, and a reflux cooling tube, 0.27 g of 4,4'-diaminobenzanilide, 0.31 g of terephthalaldehyde, 199.4 g of X-22-161B, and 300.0 g of propylene glycol monomethyl ether were charged and allowed to react with each other at 115° C. for 4 hours. Thereafter, the temperature was raised to 130° C., and the resultant was dehydrated by means of atmospheric pressure concentration, thereby obtaining a solution containing a modified siloxane compound (i-2) having an aromatic azomethine (Mw: 31,000, resin components: 90% by mass).

Preparation Example 3

Preparation of Siloxane Compound (i-3)

In a 2 liter volume heatable and coolable reactor equipped with a water determination device with a thermometer, a stirrer, and a reflux cooling tube, 0.27 g of 4-aminophenyl-4'-aminobenzoate, 0.31 g of terephthalaldehyde, 199.4 g of X-22-161B, and 300.0 g of propylene glycol monomethyl ether were charged and allowed to react with each other at 115° C. for 4 hours. Thereafter, the temperature was raised to 130° C., and the resultant was dehydrated by means of atmospheric pressure concentration, thereby obtaining a solution containing a modified siloxane compound (i-3) having an aromatic azomethine (Mw: 31,000, resin components: 90% by mass).

Preparation Example 4

Preparation of Siloxane Compound (i-4)

In a 2 liter volume heatable and coolable reactor equipped with a water determination device with a thermometer, a stirrer, and a reflux cooling tube, 0.27 g of 4,4'-diaminoazobenzene, 0.31 g of terephthalaldehyde, 199.4 g of X-22-161B, and 300.0 g of propylene glycol monomethyl ether were charged and allowed to react with each other at 115° C. for 4 hours. Thereafter, the temperature was raised to 130° C., and the resultant was dehydrated by means of atmospheric pressure concentration, thereby obtaining a solution containing a modified siloxane compound (i-4) having an aromatic azomethine (Mw: 30,000, resin components: 90% by mass).

Preparation Example 5

Preparation of Siloxane Compound (i-5)

In a 2 liter volume heatable and coolable reactor equipped with a water determination device with a thermometer, a stirrer, and a reflux cooling tube, 0.18 g of 3,3'-diethyl-4,4'-diaminodiphenylmethane, 0.19 g of terephthalaldehyde, 199.6 g of KF-8012, and 300.0 g of propylene glycol monomethyl ether were charged and allowed to react with each other at 115° C. for 4 hours. Thereafter, the temperature was raised to 130° C., and the resultant was dehydrated by means of atmospheric pressure concentration, thereby obtaining a solution containing a modified siloxane compound (i-5) having an aromatic azomethine (Mw: 50,000, resin components: 90% by mass).

Preparation Example 6

Preparation of Siloxane Compound (ii-1)

In a 2 liter volume heatable and coolable reactor equipped with a water determination device with a thermometer, a stirrer, and a reflux cooling tube, 12.9 g of 3,3'-diethyl-4,4'-diaminodiphenylmethane, 17.1 g of terephthalaldehyde, and 45.0 g of propylene glycol monomethyl ether were charged and allowed to react with each other at 115° C. for 4 hours. Thereafter, the temperature was raised to 130° C., and the resultant was dehydrated by means of atmospheric pressure concentration, thereby obtaining a solution containing an aromatic azomethine compound (resin components: 60% by mass).

Subsequently, 325.5 g of X-22-161B and 513.3 g of propylene glycol monomethyl ether were added to the above-described reaction solution and allowed to react with each other at 115° C. for 4 hours. Thereafter, the temperature was raised to 130° C., and the resultant was dehydrated by means of atmospheric pressure concentration, thereby obtaining a solution containing a modified siloxane compound (ii-1) having an aromatic azomethine (Mw: 30,000, resin components: 90% by mass).

Preparation Example 7

Preparation of Siloxane Compound (ii-2)

In a 2 liter volume heatable and coolable reactor equipped with a water determination device with a thermometer, a stirrer, and a reflux cooling tube, 8.7 g of 2,5-dimethyl-1,4-diaminobenzen, 21.3 g of terephthalaldehyde, and 45.0 g of propylene glycol monomethyl ether were charged and allowed to react with each other at 115° C. for 4 hours. Thereafter, the temperature was raised to 130° C., and the resultant was dehydrated by means of atmospheric pressure concentration, thereby obtaining a solution containing an aromatic azomethine compound (resin components: 60% by mass).

Subsequently, 413.8 g of X-22-161B and 645.7 g of propylene glycol monomethyl ether were added to the above-described reaction solution and allowed to react with each other at 115° C. for 4 hours. Thereafter, the temperature was raised to 130° C., and the resultant was dehydrated by means of atmospheric pressure concentration, thereby obtaining a solution containing a modified siloxane compound (ii-2) having an aromatic azomethine (Mw: 25,000, resin components: 90% by mass).

Preparation Example 8

Preparation of Siloxane Compound (ii-3)

In a 2 liter volume heatable and coolable reactor equipped with a water determination device with a thermometer, a stirrer, and a reflux cooling tube, 12.1 g of 4,4'-diaminobenzanilide, 17.9 g of terephthalaldehyde, and 45.0 g of propylene glycol monomethyl ether were charged and allowed to react with each other at 115° C. for 4 hours. Thereafter, the temperature was raised to 130° C., and the resultant was dehydrated by means of atmospheric pressure concentration, thereby obtaining a solution containing an aromatic azomethine compound (resin components: 60% by mass).

Subsequently, 342.1 g of X-22-161B and 538.1 g of propylene glycol monomethyl ether were added to the above-described reaction solution and allowed to react with each other at 115° C. for 4 hours. Thereafter, the temperature was raised to 130° C., and the resultant was dehydrated by means of atmospheric pressure concentration, thereby obtaining a solution containing a modified siloxane compound (ii-3) having an aromatic azomethine (Mw: 31,000, resin components: 90% by mass).

Preparation Example 9

Preparation of Siloxane Compound (ii-4)

In a 2 liter volume heatable and coolable reactor equipped with a water determination device with a thermometer, a stirrer, and a reflux cooling tube, 12.2 g of 4-aminophenyl-4'-aminobenzoate, 17.9 g of terephthalaldehyde, and 45.0 g of propylene glycol monomethyl ether were charged and allowed to react with each other at 115° C. for 4 hours. Thereafter, the temperature was raised to 130° C., and the resultant was dehydrated by means of atmospheric pressure concentration, thereby obtaining a solution containing an aromatic azomethine compound (resin components: 60% by mass).

Subsequently, 341.6 g of X-22-161B and 537.3 g of propylene glycol monomethyl ether were added to the above-described reaction solution and allowed to react with each other at 115° C. for 4 hours. Thereafter, the temperature was raised to 130° C., and the resultant was dehydrated by means of atmospheric pressure concentration, thereby obtaining a solution containing a modified siloxane compound (ii-4) having an aromatic azomethine (Mw: 31,000, resin components: 90% by mass).

Preparation Example 10

Preparation of Siloxane Compound (ii-5)

In a 2 liter volume heatable and coolable reactor equipped with a water determination device with a thermometer, a stirrer, and a reflux cooling tube, 11.6 g of 4,4'-diaminoazobenzene, 18.4 g of terephthalaldehyde, and 45.0 g of propylene glycol monomethyl ether were charged and allowed to react with each other at 115° C. for 4 hours. Thereafter, the temperature was raised to 130° C., and the resultant was dehydrated by means of atmospheric pressure concentration, thereby obtaining a solution containing an aromatic azomethine compound (resin components: 60% by mass).

Subsequently, 352.1 g of X-22-161B and 553.1 g of propylene glycol monomethyl ether were added to the above-described reaction solution and allowed to react with each other at 115° C. for 4 hours. Thereafter, the temperature was raised to 130° C., and the resultant was dehydrated by means of atmospheric pressure concentration, thereby obtaining a solution containing a modified siloxane compound (ii-5) having an aromatic azomethine (Mw: 30,000, resin components: 90% by mass).

Preparation Example 11

Preparation of Siloxane Compound (iii-1)

In a 2 liter volume heatable and coolable reactor equipped with a water determination device with a thermometer, a stirrer, and a reflux cooling tube, 5.2 g of terephthalaldehyde, 24.8 g of X-22-161A, and 45.0 g of propylene glycol monomethyl ether were charged and allowed to react with each other at 115° C. for 4 hours. Thereafter, the temperature was raised to 130° C., and the resultant was dehydrated by means of atmospheric pressure concentration, thereby obtaining a solution containing a modified siloxane compound having an aldehyde group and an azomethine group (resin components: 60% by mass).

Subsequently, 13.0 g of bis(4-(4-aminophenoxy)phenyl)propane and 44.4 g of propylene glycol monomethyl ether were added to the above-described reaction solution and allowed to react with each other at 115° C. for 4 hours. Thereafter, the temperature was raised to 130° C., and the resultant was dehydrated by means of atmospheric pressure concentration, thereby obtaining a solution containing a modified siloxane compound (111-1) having an aromatic azomethine (Mw: 40,000, resin components: 90% by mass).

Preparation Example 12

Preparation of Siloxane Compound (iii-2)

In a 2 liter volume heatable and coolable reactor equipped with a water determination device with a thermometer, a stirrer, and a reflux cooling tube, 3.0 g of terephthalaldehyde, 27.0 g of X-22-161B, and 45.0 g of propylene glycol monomethyl ether were charged and allowed to react with each other at 115° C. for 4 hours. Thereafter, the temperature was raised to 130° C., and the resultant was dehydrated by means of atmospheric pressure concentration, thereby obtaining a solution containing a modified siloxane compound having an aldehyde group and an azomethine group (resin components: 60% by mass).

Subsequently, 4.6 g of 3,3'-diethyl-4,4'-diaminodiphenylmethane and 31.9 g of propylene glycol monomethyl ether were added to the above-described reaction solution and allowed to react with each other at 115° C. for 4 hours. Thereafter, the temperature was raised to 130° C., and the resultant was dehydrated by means of atmospheric pressure concentration, thereby obtaining a solution containing a modified siloxane compound (iii-2) having an aromatic azomethine (Mw: 70,000, resin components: 90% by mass).

Preparation Example 13

Preparation of Siloxane Compound (iii-3)

In a 2 liter volume heatable and coolable reactor equipped with a water determination device with a thermometer, a stirrer, and a reflux cooling tube, 3.0 g of terephthalaldehyde, 27.0 g of X-22-161B, and 45.0 g of propylene glycol monomethyl ether were charged and allowed to react with each other at 115° C. for 4 hours. Thereafter, the temperature was raised to 130° C., and the resultant was dehydrated by means of atmospheric pressure concentration, thereby obtaining a solution containing a modified siloxane compound having an aldehyde group and an azomethine group (resin components: 60% by mass).

Subsequently, 4.1 g of 4,4'-diaminobenzanilide and 31.2 g of propylene glycol monomethyl ether were added to the above-described reaction solution and allowed to react with each other at 115° C. for 4 hours. Thereafter, the temperature was raised to 130° C., and the resultant was dehydrated by means of atmospheric pressure concentration, thereby obtaining a solution containing a modified siloxane compound (iii-3) having an aromatic azomethine (Mw: 69,000, resin components: 90% by mass).

Preparation Example 14

Preparation of Siloxane Compound (iii-4)

In a 2 liter volume heatable and coolable reactor equipped with a water determination device with a thermometer, a stirrer, and a reflux cooling tube, 3.0 g of terephthalaldehyde, 27.0 g of X-22-161B, and 45.0 g of propylene glycol monomethyl ether were charged and allowed to react with each other at 115° C. for 4 hours. Thereafter, the temperature was raised to 130° C., and the resultant was dehydrated by means of atmospheric pressure concentration, thereby obtaining a solution containing a modified siloxane compound having an aldehyde group and an azomethine group (resin components: 60% by mass).

Subsequently, 4.5 g of 4-aminophenyl-4'-aminobenzoate and 31.2 g of propylene glycol monomethyl ether were added to the above-described reaction solution and allowed to react with each other at 115° C. for 4 hours. Thereafter, the temperature was raised to 130° C., and the resultant was dehydrated by means of atmospheric pressure concentration, thereby obtaining a solution containing a modified siloxane compound (iii-4) having an aromatic azomethine (Mw: 69,000, resin components: 90% by mass).

Preparation Example 15

Preparation of Siloxane Compound (iii-5)

In a 2 liter volume heatable and coolable reactor equipped with a water determination device with a thermometer, a stirrer, and a reflux cooling tube, 3.0 g of terephthalaldehyde, 27.0 g of X-22-161B, and 45.0 g of propylene glycol monomethyl ether were charged and allowed to react with each other at 115° C. for 4 hours. Thereafter, the temperature was raised to 130° C., and the resultant was dehydrated by means of atmospheric pressure concentration, thereby obtaining a solution containing a modified siloxane compound having an aldehyde group and an azomethine group (resin components: 60% by mass).

Subsequently, 3.9 g of 4,4'-diaminoazobenzene and 30.8 g of propylene glycol monomethyl ether were added to the above-described reaction solution and allowed to react with each other at 115° C. for 4 hours. Thereafter, the temperature was raised to 130° C., and the resultant was dehydrated by means of atmospheric pressure concentration, thereby obtaining a solution containing a modified siloxane compound (iii-5) having an aromatic azomethine (Mw: 68,000, resin components: 90% by mass).

Preparation Example 16

Preparation of Modified Imide Resin (j-1) Having an Aromatic Azomethine

In a 2 liter volume heatable and coolable reactor equipped with a water determination device with a thermometer, a stirrer, and a reflux cooling tube, 62.4 g of the solution containing the modified siloxane compound (i-1) having an aromatic azomethine (resin components: 90% by mass), 243.9 g of 2,2-bis(4-(4-maleimidophenoxy)phenyl) propane, and 443.8 g of propylene glycol monomethyl ether were charged and allowed to react with each other at 115° C. for 4 hours. Thereafter, the temperature was raised to 130° C., and the resultant was subjected to atmospheric pressure concentration, thereby obtaining a solution containing a modified imide resin (j-1) having an aromatic azomethine (resin components: 60% by mass).

Preparation Example 17

Preparation of Modified Imide Resin (j-2) Having an Aromatic Azomethine

In a 2 liter volume heatable and coolable reactor equipped with a water determination device with a thermometer, a stirrer, and a reflux cooling tube, 62.5 g of the solution containing the modified siloxane compound (i-2) having an aromatic azomethine (resin components: 90% by mass), 243.8 g of 2,2-bis(4-(4-maleimidophenoxy)phenyl)propane, and 443.8 g of propylene glycol monomethyl ether were charged and allowed to react with each other at 115° C. for 4 hours. Thereafter, the temperature was raised to 130° C., and the resultant was subjected to atmospheric pressure concentration, thereby obtaining a solution containing a modified imide resin (j-2) having an aromatic azomethine (resin components: 60% by mass).

Preparation Example 18

Preparation of Modified Imide Resin (j-3) Having an Aromatic Azomethine

In a 2 liter volume heatable and coolable reactor equipped with a water determination device with a thermometer, a stirrer, and a reflux cooling tube, 62.5 g of the solution containing the modified siloxane compound (ii-1) having an aromatic azomethine (resin components: 90% by mass), 243.7 g of 2,2-bis(4-(4-maleimidophenoxy)phenyl)propane, and 443.8 g of propylene glycol monomethyl ether were charged and allowed to react with each other at 115° C. for 4 hours. Thereafter, the temperature was raised to 130° C., and the resultant was subjected to atmospheric pressure concentration, thereby obtaining a solution containing a modified imide resin (j-3) having an aromatic azomethine (resin components: 60% by mass).

Preparation Example 19

Preparation of Modified Imide Resin (j-4) Having an Aromatic Azomethine

In a 2 liter volume heatable and coolable reactor equipped with a water determination device with a thermometer, a stirrer, and a reflux cooling tube, 62.3 g of the solution containing the modified siloxane compound (ii-3) having an aromatic azomethine (resin components: 90% by mass), 243.9 g of 2,2-bis(4-(4-maleimidophenoxy)phenyl)propane, and 443.8 g of propylene glycol monomethyl ether were charged and allowed to react with each other at 115° C. for 4 hours. Thereafter, the temperature was raised to 130° C., and the resultant was subjected to atmospheric pressure concentration, thereby obtaining a solution containing a modified imide resin (j-4) having an aromatic azomethine (resin components: 60% by mass).

Preparation Example 20

Preparation of Modified Imide Resin (j-5) Having an Aromatic Azomethine

In a 2 liter volume heatable and coolable reactor equipped with a water determination device with a thermometer, a stirrer, and a reflux cooling tube, 62.5 g of the solution containing the modified siloxane compound (iii-2) having an aromatic azomethine (resin components: 90% by mass), 243.8 g of 2,2-bis(4-(4-maleimidophenoxy)phenyl)propane, and 443.8 g of propylene glycol monomethyl ether were charged and allowed to react with each other at 115° C. for 4 hours. Thereafter, the temperature was raised to 130° C., and the resultant was subjected to atmospheric pressure concentration, thereby obtaining a solution containing a modified imide resin (j-5) having an aromatic azomethine (resin components: 60% by mass).

Preparation Example 21

Preparation of Modified Imide Resin (j-6) Having an Aromatic Azomethine

In a 2 liter volume heatable and coolable reactor equipped with a water determination device with a thermometer, a stirrer, and a reflux cooling tube, 61.7 g of the solution containing the modified siloxane compound (iii-3) having an aromatic azomethine (resin components: 90% by mass), 244.4 g of 2,2-bis(4-(4-maleimidophenoxy)phenyl)propane, and 443.8 g of propylene glycol monomethyl ether were charged and allowed to react with each other at 115° C. for 4 hours. Thereafter, the temperature was raised to 130° C., and the resultant was subjected to atmospheric pressure concentration, thereby obtaining a solution containing a modified imide resin (j-6) having an aromatic azomethine (resin components: 60% by mass).

Preparation Example 22

Preparation of Modified Imide Resin (k-1) Having an Acidic Substituent and an Aromatic Azomethine In a 2 liter volume heatable and coolable reactor equipped with a water determination device with a thermometer, a stirrer, and a reflux cooling tube, 62.5 g of the solution containing the modified siloxane compound (i-1) having an aromatic azomethine (resin components: 90% by mass), 238.1 g of 2,2-bis(4-(4-maleimidophenoxy)phenyl)propane, 5.7 g of p-aminophenol, and 443.8 g of propylene glycol monomethyl ether were charged and allowed to react with each other at 115° C. for 4 hours. Thereafter, the temperature was raised to 130° C., and the resultant was subjected to atmospheric pressure concentration, thereby obtaining a solution containing a modified imide resin (k-1) having an acidic substituent and an aromatic azomethine (resin components: 60% by mass).

Preparation Example 23

Preparation of Modified Imide Resin (k-2) Having an Acidic Substituent and an Aromatic Azomethine In a 2 liter volume heatable and coolable reactor equipped with a water determination device with a thermometer, a stirrer, and a reflux cooling tube, 62.6 g of the solution containing the modified siloxane compound (i-2) having an aromatic azomethine (resin components: 90% by mass), 238.0 g of 2,2-bis(4-(4-maleimidophenoxy)phenyl)propane, 5.7 g of p-aminophenol, and 443.7 g of propylene glycol monomethyl ether were charged and allowed to react with each other at 115° C. for 4 hours. Thereafter, the temperature was raised to 130° C., and the resultant was subjected to atmospheric pressure concentration, thereby obtaining a solution containing a modified imide resin (k-2) having an acidic substituent and an aromatic azomethine (resin components: 60% by mass).

Preparation Example 24

Preparation of Modified Imide Resin (k-3) Having an Acidic Substituent and an Aromatic Azomethine In a 2 liter volume heatable and coolable reactor equipped with a water determination device with a thermometer, a stirrer, and a reflux cooling tube, 62.5 g of the solution containing the modified siloxane compound (ii-1) having an aromatic azomethine (resin components: 90% by mass), 238.0 g of 2,2-bis(4-(4-maleimidophenoxy)phenyl)propane, 5.7 g of p-aminophenol, and 443.8 g of propylene glycol monomethyl ether were charged and allowed to react with each other at 115° C. for 4 hours. Thereafter, the temperature was raised to 130° C., and the resultant was subjected to atmospheric pressure concentration, thereby obtaining a solution containing a modified imide resin (k-3) having an acidic substituent and an aromatic azomethine (resin components: 60% by mass).

Preparation Example 25

Preparation of Modified Imide Resin (k-4) Having an Acidic Substituent and an Aromatic Azomethine In a 2 liter volume heatable and coolable reactor equipped with a water determination device with a thermometer, a stirrer, and a reflux cooling tube, 62.3 g of the solution containing the modified siloxane compound (ii-3) having an aromatic azomethine (resin components: 90% by mass), 238.2 g of 2,2-bis(4-(4-maleimidophenoxy)phenyl)propane, 5.7 g of p-aminophenol, and 443.8 g of propylene glycol monomethyl ether were charged and allowed to react with each other at 115° C. for 4 hours. Thereafter, the temperature was raised to 130° C., and the resultant was subjected to atmospheric pressure concentration, thereby obtaining a solution containing a modified imide resin (k-4) having an acidic substituent and an aromatic azomethine (resin components: 60% by mass).

Preparation Example 26

Preparation of Modified Imide Resin (k-5) Having an Acidic Substituent and an Aromatic Azomethine In a 2 liter volume heatable and coolable reactor equipped with a water determination device with a thermometer, a stirrer, and a reflux cooling tube, 62.6 g of the solution containing the modified siloxane compound (iii-2) having an aromatic azomethine (resin components: 90% by mass), 238.0 g of 2,2-bis(4-(4-maleimidophenoxy)phenyl)propane, 5.7 g of p-aminophenol, and 443.7 g of propylene glycol monomethyl ether were charged and allowed to react with each other at 115° C. for 4 hours. Thereafter, the temperature was raised to 130° C., and the resultant was subjected to atmospheric pressure concentration, thereby obtaining a solution containing a modified imide resin (k-5) having an acidic substituent and an aromatic azomethine (resin components: 60% by mass).

Preparation Example 27

Preparation of Modified Imide Resin (k-6) Having an Acidic Substituent and an Aromatic Azomethine In a 2 liter volume heatable and coolable reactor equipped with a water determination device with a thermometer, a stirrer, and a reflux cooling tube, 61.8 g of the solution containing the modified siloxane compound (iii-3) having an aromatic azomethine (resin components: 90% by mass), 238.6 g of 2,2-bis(4-(4-maleimidophenoxy)phenyl)propane, 5.7 g of p-aminophenol, and 443.8 g of propylene glycol monomethyl ether were charged and allowed to react with each other at 115° C. for 4 hours. Thereafter, the temperature was raised to 130° C., and the resultant was subjected to atmospheric pressure concentration, thereby obtaining a solution containing a modified imide resin (k-6) having an acidic substituent and an aromatic azomethine (resin components: 60% by mass).

Examples 1 to 39 and Comparative Examples 1 to 12

Varnishes having a resin content of 65% by mass were obtained by using each of the solutions containing the modified siloxane compound (each of i-1 to i-5, ii-1 to ii-5, and iii-1 to iii-5) having an aromatic azomethine as obtained in Preparation Examples 1 to 15, the solutions containing the modified imide resin (each of j-1 to j-6) having an aromatic azomethine as obtained in Preparation Examples 16 to 21, and the solutions containing the modified imide resin having an acidic substituent and an aromatic azomethine as obtained in Preparation Examples 22 to 27, and the following aromatic amide compound (A), aromatic aldehyde compound (B), siloxane compound (C), maleimide compound (D), amine compound (E) having an acidic substituent, thermoplastic elastomer (F), thermosetting resin (G), inorganic filler (H), and curing accelerator (I) as well as methyl ethyl ketone as a diluting solvent and mixing them in a blending proportion (parts by mass) shown in Tables 1 to 9, respectively.

Subsequently, each of the above-described varnishes was coated in a resin thickness after drying of 35 µm on a 16 µm-thick polyethylene terephthalate-made film by using a film applicator (PI-1210, manufactured by Tester Sangyo Co., Ltd.) and heated for drying at 160° C. for 10 minutes, thereby obtaining a resin powder of a semi-cured material. The support is not particularly limited, and general-purpose materials can be used. In addition, the coating method is not particularly limited, too, and the coating may be conducted by using a usual table coating machine.

This resin powder was put into a frame of a TEFLON (registered trademark) sheet, and a 12 µm-thick electrolytic copper foil glossy surface was disposed on the top and bottom thereof, followed by pressing at a pressure of 2.0 MPa and at a temperature of 240° C. for 60 minutes. Thereafter, the electrolytic foils were removed to obtain a resin plate.

In addition, the above-described varnish was impregnated in and coated on an E-glass sheet having a thickness of 0.1 mm and then heated for drying at 160° C. for 10 minutes, thereby obtaining a prepreg having a resin content of 48% by mass.

Four sheets of this prepreg were superimposed, and a 12 µm-thick electrolytic copper foil was disposed on the top and bottom thereof, followed by pressing at a pressure of 3.0 MPa and at a temperature of 240° C. for 60 minutes, thereby obtaining a copper clad laminated plate.

The measurement and evaluation results of the obtained resin plates and copper clad laminated plates are shown in Tables 1 to 9.

Aromatic Amine Compound (A):
  KAYAHARD A-A: 3,3'-Diethyl-4,4'-diaminodiphenylmethane [a trade name, manufactured by Nippon Kayaku Co., Ltd.]
  4,4'-Diaminobenzanilide [a trade name, manufactured by Tokyo Chemical Industry Co., Ltd.]
  4-Aminophenyl-4'-aminobenzoate [a trade name, manufactured by Changzhou Sunlight Pharmaceutical Co., Ltd.]
Aromatic Aldehyde Compound (B):
  TPAL: Terephthalaldehyde [a trade name, manufactured by Toray Fine Chemicals Co., Ltd.]
Siloxane Compound (C):
  X-22-161B: Amino-modified siloxane at the both terminals thereof [a trade name, manufactured by Shin-Etsu Chemical Co., Ltd.]
Maleimide Compound (D):
  BMI: Bis(4-maleimidophenyl)methane [a trade name, manufactured by K.I Chemical Industry Co., Ltd.]
  BMI-4000: 2,2-Bis(4-(4-maleimidophenoxy)phenyl)propane [a trade name, manufactured by Daiwa Kasei Industry Co., Ltd.]
Amine Compound (E) Having an Acidic Substituent:
  p-Aminophenol [a trade name, manufactured by Kanto Chemical Co., Inc.]
Thermoplastic Elastomer (F)
  TUFTEC H1043: Hydrogenated styrene-butadiene copolymer resin [a trade name, manufactured by Asahi Kasei Chemicals Corporation]
  EPOFRIEND CT-310: Epoxy-modified styrene-butadiene copolymer resin [a trade name, manufactured by Daicel Corporation]
Thermosetting Resin (G):
  PT-30: Novolac type cyanate resin [a trade name, manufactured by Lonza Japan Ltd.]
  NC-7000L: α-Naphthol/cresol novolac type epoxy resin [a trade name, manufactured by Nippon Kayaku Co., Ltd.]
Inorganic Filler (H):
  SC2050-KNK: Fused silica [a trade name, manufactured by Admatechs Co., Ltd.]
  Zinc molybdate [a trade name: KEMGARD 1100, manufactured by The Sherwin-Williams Company]
Curing Accelerator (I):
  Zinc(II) naphthenate mineral spirit solution (Zn: 8%) [a trade name, manufactured by Tokyo Chemical Industry Co., Ltd.]
  G-8009L: Isocyanate-masked imidazole [a trade name, manufactured by Dai-ichi Kogyo Seiyaku Co., Ltd.]

TPP-MK: Tetraphenylphosphonium tetra-p-tolylborate [a trade name, manufactured by Hokko Chemical Industry Co., Ltd.]

Hereunder, the blending amounts (parts by mass) of the solutions containing each of the siloxane compounds (i-1) to (iii-5), the solutions containing each of the modified imide resins (j-1) to (j-6) having an aromatic azomethine, and the solutions containing each of the modified imide resins (k-1) to (k-6) having an acidic substituent and an aromatic azomethine show values of the resin components as converted into a solid content.

TABLE 1

|  |  | Unit | Example 1 | Example 2 | Example 3 | Example 4 | Example 5 | Example 6 |
|---|---|---|---|---|---|---|---|---|
| Solution containing modified siloxane compound having an aromatic azomethine | i-1 | Parts by mass | 10 |  |  |  |  |  |
|  | i-2 | Parts by mass |  | 10 |  |  |  |  |
|  | i-3 | Parts by mass |  |  | 10 |  |  |  |
|  | i-4 | Parts by mass |  |  |  | 10 |  |  |
|  | i-5 | Parts by mass |  |  |  |  | 10 |  |
|  | ii-1 | Parts by mass |  |  |  |  |  | 10 |
|  | ii-2 | Parts by mass |  |  |  |  |  |  |
|  | ii-3 | Parts by mass |  |  |  |  |  |  |
|  | ii-4 | Parts by mass |  |  |  |  |  |  |
|  | ii-5 | Parts by mass |  |  |  |  |  |  |
|  | iii-1 | Parts by mass |  |  |  |  |  |  |
|  | iii-2 | Parts by mass |  |  |  |  |  |  |
|  | iii-3 | Parts by mass |  |  |  |  |  |  |
|  | iii-4 | Parts by mass |  |  |  |  |  |  |
|  | iii-5 | Parts by mass |  |  |  |  |  |  |
| Solution containing modified imide resin having an aromatic azomethine | j-1 | Parts by mass |  |  |  |  |  |  |
|  | j-2 | Parts by mass |  |  |  |  |  |  |
|  | j-3 | Parts by mass |  |  |  |  |  |  |
|  | j-4 | Parts by mass |  |  |  |  |  |  |
|  | j-5 | Parts by mass |  |  |  |  |  |  |
|  | j-6 | Parts by mass |  |  |  |  |  |  |
| Solution containing modified imide resin having an acidic substituent and an aromatic azomethine | k-1 | Parts by mass |  |  |  |  |  |  |
|  | k-2 | Parts by mass |  |  |  |  |  |  |
|  | k-3 | Parts by mass |  |  |  |  |  |  |
|  | k-4 | Parts by mass |  |  |  |  |  |  |
|  | k-5 | Parts by mass |  |  |  |  |  |  |
|  | k-6 | Parts by mass |  |  |  |  |  |  |
| Maleimide compound (D) | BMI | Parts by mass | 90 | 90 |  |  |  |  |
|  | BMI-4000 | Parts by mass |  |  | 90 | 90 | 90 | 80 |
| Amine compound (E) having an acidic substituent | p-Aminophenol | Parts by mass |  |  |  |  |  | 10 |
| Thermoplastic elastomer (F) | TUFTEC H1043 | Parts by mass |  |  |  |  |  |  |
|  | EPOFRIEND CT-310 | Parts by mass |  |  |  |  |  |  |
| Thermosetting resin (G) | PT-30 | Parts by mass |  |  |  |  |  |  |
|  | NC-7000L | Parts by mass |  |  |  |  |  |  |
| Inorganic filler (H) | SC2050-KNK | Parts by mass |  |  |  |  |  |  |
|  | KEMGARD 1100 | Parts by mass |  |  |  |  |  |  |
| Curing accelerator (I) | Zinc(II) naphthenate | Parts by mass |  |  |  |  |  |  |
|  | G-8009L | Parts by mass | 1.0 | 1.0 |  |  |  |  |
|  | TPP-MK | Parts by mass |  |  | 1.0 | 1.0 | 1.0 | 1.0 |
| Properties of resin plate | (1) Cure shrinkage | % | 0.18 | 0.18 | 0.16 | 0.16 | 0.16 | 0.13 |
| Properties of laminated plate | (2) Glass transition temperature | °C. | 230 | 230 | 220 | 220 | 220 | 220 |
|  | (3) Coefficient of thermal expansion | ppm/°C. | 6.2 | 6.2 | 6.2 | 6.2 | 6.2 | 6.1 |
|  | (4) Copper foil adhesiveness | kN/m | 0.9 | 1.0 | 1.0 | 0.9 | 0.9 | 1.0 |
|  | (5) Copper-stuck solder heat resistance | — | Not swollen | Not swollen | Not swollen | Not swollen | Not swollen | Not swollen |
|  | (6) Bending elastic modulus | GPa | 30 | 30 | 30 | 30 | 30 | 31 |
|  | (7) Dielectric properties |  |  |  |  |  |  |  |
|  | Dielectric constant | — | 4.2 | 4.2 | 4.2 | 4.2 | 4.2 | 4.2 |
|  | Dielectric tangent | — | 0.008 | 0.008 | 0.008 | 0.008 | 0.008 | 0.008 |

TABLE 2

|  |  | Unit | Example 7 | Example 8 | Example 9 | Example 10 | Example 11 | Example 12 |
|---|---|---|---|---|---|---|---|---|
| Solution containing modified siloxane compound having | i-1 | Parts by mass |  |  |  |  |  |  |
|  | i-2 | Parts by mass |  |  |  |  |  |  |
|  | i-3 | Parts by mass |  |  |  |  |  |  |

TABLE 2-continued

|  |  | Unit | Example 7 | Example 8 | Example 9 | Example 10 | Example 11 | Example 12 |
|---|---|---|---|---|---|---|---|---|
| an aromatic azomethine | i-4 | Parts by mass |  |  |  |  |  |  |
|  | i-5 | Parts by mass |  |  |  |  |  |  |
|  | ii-1 | Parts by mass | 10 |  |  |  |  |  |
|  | ii-2 | Parts by mass |  | 10 | 10 |  |  |  |
|  | ii-3 | Parts by mass |  |  |  | 10 |  |  |
|  | ii-4 | Parts by mass |  |  |  |  | 10 |  |
|  | ii-5 | Parts by mass |  |  |  |  |  | 10 |
|  | iii-1 | Parts by mass |  |  |  |  |  |  |
|  | iii-2 | Parts by mass |  |  |  |  |  |  |
|  | iii-3 | Parts by mass |  |  |  |  |  |  |
|  | iii-4 | Parts by mass |  |  |  |  |  |  |
|  | iii-5 | Parts by mass |  |  |  |  |  |  |
| Solution containing modified imide resin having an aromatic azomethine | j-1 | Parts by mass |  |  |  |  |  |  |
|  | j-2 | Parts by mass |  |  |  |  |  |  |
|  | j-3 | Parts by mass |  |  |  |  |  |  |
|  | j-4 | Parts by mass |  |  |  |  |  |  |
|  | j-5 | Parts by mass |  |  |  |  |  |  |
|  | j-6 | Parts by mass |  |  |  |  |  |  |
| Solution containing modified imide resin having an acidic substituent and an aromatic azomethine | k-1 | Parts by mass |  |  |  |  |  |  |
|  | k-2 | Parts by mass |  |  |  |  |  |  |
|  | k-3 | Parts by mass |  |  |  |  |  |  |
|  | k-4 | Parts by mass |  |  |  |  |  |  |
|  | k-5 | Parts by mass |  |  |  |  |  |  |
|  | k-6 | Parts by mass |  |  |  |  |  |  |
| Maleimide compound (D) | BMI | Parts by mass |  | 60 |  | 60 | 60 |  |
|  | BMI-4000 | Parts by mass | 65 |  | 60 |  |  | 60 |
| Amine compound (E) having an acidic substituent | p-Aminophenol | Parts by mass | 5 | 5 | 5 | 5 | 5 | 5 |
| Thermoplastic elastomer (F) | TUFTEC H1043 | Parts by mass |  | 10 | 10 | 10 | 10 | 10 |
|  | EPOFRIEND CT-310 | Parts by mass | 20 |  |  |  |  |  |
| Thermosetting resin (G) | PT-30 | Parts by mass |  |  | 15 |  |  | 15 |
|  | NC-7000L | Parts by mass |  | 15 |  | 15 | 15 |  |
| Inorganic filler (H) | SC2050-KNK | Parts by mass |  |  |  |  |  |  |
|  | KEMGARD 1100 | Parts by mass |  |  |  |  |  |  |
| Curing accelerator (I) | Zinc(II) naphthenate | Parts by mass |  |  | 0.5 |  |  | 0.5 |
|  | G-8009L | Parts by mass |  | 1.0 |  | 1.0 | 1.0 |  |
|  | TPP-MK | Parts by mass | 1.0 |  | 1.0 |  |  | 1.0 |
| Properties of resin plate | (1) Cure shrinkage | % | 0.08 | 0.12 | 0.12 | 0.12 | 0.12 | 0.12 |
| Properties of laminated plate | (2) Glass transition temperature | ° C. | 210 | 220 | 220 | 220 | 220 | 220 |
|  | (3) Coefficient of thermal expansion | ppm/° C. | 5.8 | 6.4 | 6.4 | 6.4 | 6.4 | 6.4 |
|  | (4) Copper foil adhesiveness | kN/m | 0.8 | 0.8 | 0.8 | 0.9 | 0.9 | 0.8 |
|  | (5) Copper-stuck solder heat resistance | — | Not swollen | Not swollen | Not swollen | Not swollen | Not swollen | Not swollen |
|  | (6) Bending elastic modulus | GPa | 28 | 29 | 29 | 29 | 29 | 29 |
|  | (7) Dielectric properties |  |  |  |  |  |  |  |
|  | Dielectric constant | — | 3.9 | 4.4 | 4.2 | 4.4 | 4.4 | 4.2 |
|  | Dielectric tangent | — | 0.006 | 0.010 | 0.008 | 0.010 | 0.010 | 0.008 |

TABLE 3

|  |  | Unit | Example 13 | Example 14 | Example 15 | Example 16 | Example 17 | Example 18 |
|---|---|---|---|---|---|---|---|---|
| Solution containing modified siloxane compound having an aromatic azomethine | i-1 | Parts by mass |  |  |  |  |  |  |
|  | i-2 | Parts by mass |  |  |  |  |  |  |
|  | i-3 | Parts by mass |  |  |  |  |  |  |
|  | i-4 | Parts by mass |  |  |  |  |  |  |
|  | i-5 | Parts by mass |  |  |  |  |  |  |
|  | ii-1 | Parts by mass |  |  |  |  |  |  |
|  | ii-2 | Parts by mass |  |  |  |  |  |  |
|  | ii-3 | Parts by mass |  |  |  |  |  |  |
|  | ii-4 | Parts by mass |  |  |  |  |  |  |
|  | ii-5 | Parts by mass |  |  |  |  |  |  |
|  | iii-1 | Parts by mass | 10 | 10 |  |  |  |  |
|  | iii-2 | Parts by mass |  |  | 10 |  |  |  |
|  | iii-3 | Parts by mass |  |  |  | 10 |  |  |

TABLE 3-continued

|  |  | Unit | Example 13 | Example 14 | Example 15 | Example 16 | Example 17 | Example 18 |
|---|---|---|---|---|---|---|---|---|
| | iii-4 | Parts by mass | | | | | 10 | |
| | iii-5 | Parts by mass | | | | | | 10 |
| Solution containing modified imide resin having an aromatic azomethine | j-1 | Parts by mass | | | | | | |
| | j-2 | Parts by mass | | | | | | |
| | j-3 | Parts by mass | | | | | | |
| | j-4 | Parts by mass | | | | | | |
| | j-5 | Parts by mass | | | | | | |
| | j-6 | Parts by mass | | | | | | |
| Solution containing modified imide resin having an acidic substituent and an aromatic azomethine | k-1 | Parts by mass | | | | | | |
| | k-2 | Parts by mass | | | | | | |
| | k-3 | Parts by mass | | | | | | |
| | k-4 | Parts by mass | | | | | | |
| | k-5 | Parts by mass | | | | | | |
| | k-6 | Parts by mass | | | | | | |
| Maleimide compound (D) | BMI | Parts by mass | | | | | | |
| | BMI-4000 | Parts by mass | 65 | 65 | 65 | 65 | 65 | 65 |
| Amine compound (E) having an acidic substituent | p-Aminophenol | Parts by mass | 5 | 5 | 5 | 5 | 5 | 5 |
| Thermoplastic elastomer (F) | TUFTEC H1043 | Parts by mass | | 10 | | 10 | | |
| | EPOFRIEND CT-310 | Parts by mass | 15 | | 15 | | 15 | 15 |
| Thermosetting resin (G) | PT-30 | Parts by mass | | 10 | | 10 | | |
| | NC-7000L | Parts by mass | 5 | | 5 | | 5 | 5 |
| Inorganic filler (H) | SC2050-KNK | Parts by mass | 200 | 200 | 200 | 200 | 200 | 200 |
| | KEMGARD 1100 | Parts by mass | | 20 | 20 | 20 | 20 | 20 |
| Curing accelerator (I) | Zinc(II) naphthenate | Parts by mass | | 0.5 | | 0.5 | | |
| | G-8009L | Parts by mass | | | | | | |
| | TPP-MK | Parts by mass | 1.0 | 1.0 | 1.0 | 1.0 | 1.0 | 1.0 |
| Properties of resin plate | (1) Cure shrinkage | % | 0.07 | 0.09 | 0.08 | 0.09 | 0.08 | 0.08 |
| Properties of laminated plate | (2) Glass transition temperature | °C. | 210 | 220 | 210 | 220 | 210 | 210 |
| | (3) Coefficient of thermal expansion | ppm/°C. | 5.6 | 5.9 | 5.7 | 5.9 | 5.7 | 5.7 |
| | (4) Copper foil adhesiveness | kN/m | 0.8 | 0.8 | 0.7 | 0.9 | 0.8 | 0.7 |
| | (5) Copper-stuck solder heat resistance | — | Not swollen | Not swollen | Not swollen | Not swollen | Not swollen | Not swollen |
| | (6) Bending elastic modulus | GPa | 30 | 32 | 31 | 32 | 31 | 31 |
| | (7) Dielectric properties | | | | | | | |
| | Dielectric constant | — | 4.0 | 4.1 | 4.0 | 4.1 | 4.0 | 4.0 |
| | Dielectric tangent | — | 0.006 | 0.006 | 0.006 | 0.006 | 0.006 | 0.006 |

TABLE 4

|  |  | Unit | Example 19 | Example 20 | Example 21 | Example 22 | Example 23 | Example 24 |
|---|---|---|---|---|---|---|---|---|
| Solution containing modified siloxane compound having an aromatic azomethine | i-1 | Parts by mass | | | | | | |
| | i-2 | Parts by mass | | | | | | |
| | i-3 | Parts by mass | | | | | | |
| | i-4 | Parts by mass | | | | | | |
| | i-5 | Parts by mass | | | | | | |
| | ii-1 | Parts by mass | | | | | | |
| | ii-2 | Parts by mass | | | | | | |
| | ii-3 | Parts by mass | | | | | | |
| | ii-4 | Parts by mass | | | | | | |
| | ii-5 | Parts by mass | | | | | | |
| | iii-1 | Parts by mass | | | | | | |
| | iii-2 | Parts by mass | | | | | | |
| | iii-3 | Parts by mass | | | | | | |
| | iii-4 | Parts by mass | | | | | | |
| | iii-5 | Parts by mass | | | | | | |
| Solution containing modified imide resin having an aromatic azomethine | j-1 | Parts by mass | 100 | | | | | |
| | j-2 | Parts by mass | | 100 | | | | |
| | j-3 | Parts by mass | | | 95 | 80 | | |
| | j-4 | Parts by mass | | | | | 80 | |
| | j-5 | Parts by mass | | | | | | 75 |
| | j-6 | Parts by mass | | | | | | |

TABLE 4-continued

|  |  | Unit | Example 19 | Example 20 | Example 21 | Example 22 | Example 23 | Example 24 |
|---|---|---|---|---|---|---|---|---|
| Solution containing modified imide resin having an acidic substituent and an aromatic azomethine | k-1 | Parts by mass |  |  |  |  |  |  |
|  | k-2 | Parts by mass |  |  |  |  |  |  |
|  | k-3 | Parts by mass |  |  |  |  |  |  |
|  | k-4 | Parts by mass |  |  |  |  |  |  |
|  | k-5 | Parts by mass |  |  |  |  |  |  |
|  | k-6 | Parts by mass |  |  |  |  |  |  |
| Maleimide compound (D) | BMI | Parts by mass |  |  |  |  |  |  |
|  | BMI-4000 | Parts by mass |  |  |  |  |  |  |
| Amine compound (E) having an acidic substituent | p-Aminophenol | Parts by mass |  |  | 5 | 5 | 5 | 5 |
| Thermoplastic elastomer (F) | TUFTEC H1043 | Parts by mass |  |  |  |  |  |  |
|  | EPOFRIEND CT-310 | Parts by mass |  |  |  | 15 | 15 | 15 |
| Thermosetting resin (G) | PT-30 | Parts by mass |  |  |  |  |  |  |
|  | NC-7000L | Parts by mass |  |  |  |  |  | 5 |
| Inorganic filler (H) | SC2050-KNK | Parts by mass |  |  |  |  |  |  |
|  | KEMGARD 1100 | Parts by mass |  |  |  |  |  |  |
| Curing accelerator (I) | Zinc(II) naphthenate | Parts by mass |  |  |  |  |  |  |
|  | G-8009L | Parts by mass | 1.0 | 1.0 |  |  |  |  |
|  | TPP-MK | Parts by mass |  |  | 1.0 | 1.0 | 1.0 | 1.0 |
| Properties of resin plate | (1) Cure shrinkage | % | 0.17 | 0.17 | 0.16 | 0.07 | 0.07 | 0.07 |
| Properties of laminated plate | (2) Glass transition temperature | °C. | 220 | 220 | 220 | 210 | 210 | 210 |
|  | (3) Coefficient of thermal expansion | ppm/°C. | 6.2 | 6.2 | 6.1 | 5.7 | 5.7 | 5.7 |
|  | (4) Copper foil adhesiveness | kN/m | 0.9 | 1.0 | 1.0 | 0.8 | 0.9 | 0.7 |
|  | (5) Copper-stuck solder heat resistance | — | Not swollen | Not swollen | Not swollen | Not swollen | Not swollen | Not swollen |
|  | (6) Bending elastic modulus | GPa | 30 | 30 | 31 | 29 | 29 | 29 |
|  | (7) Dielectric properties |  |  |  |  |  |  |  |
|  | Dielectric constant | — | 4.2 | 4.2 | 4.2 | 3.9 | 3.9 | 3.9 |
|  | Dielectric tangent | — | 0.008 | 0.008 | 0.008 | 0.006 | 0.006 | 0.006 |

TABLE 5

|  |  | Unit | Example 25 | Example 26 | Example 27 | Example 28 | Example 29 | Example 30 |
|---|---|---|---|---|---|---|---|---|
| Solution containing modified siloxane compound having an aromatic azomethine | i-1 | Parts by mass |  |  |  |  |  |  |
|  | i-2 | Parts by mass |  |  |  |  |  |  |
|  | i-3 | Parts by mass |  |  |  |  |  |  |
|  | i-4 | Parts by mass |  |  |  |  |  |  |
|  | i-5 | Parts by mass |  |  |  |  |  |  |
|  | ii-1 | Parts by mass |  |  |  |  |  |  |
|  | ii-2 | Parts by mass |  |  |  |  |  |  |
|  | ii-3 | Parts by mass |  |  |  |  |  |  |
|  | ii-4 | Parts by mass |  |  |  |  |  |  |
|  | ii-5 | Parts by mass |  |  |  |  |  |  |
|  | iii-1 | Parts by mass |  |  |  |  |  |  |
|  | iii-2 | Parts by mass |  |  |  |  |  |  |
|  | iii-3 | Parts by mass |  |  |  |  |  |  |
|  | iii-4 | Parts by mass |  |  |  |  |  |  |
|  | iii-5 | Parts by mass |  |  |  |  |  |  |
| Solution containing modified imide resin having an aromatic azomethine | j-1 | Parts by mass |  |  |  |  |  |  |
|  | j-2 | Parts by mass |  |  |  |  |  |  |
|  | j-3 | Parts by mass |  | 70 | 70 |  |  |  |
|  | j-4 | Parts by mass |  |  |  |  |  |  |
|  | j-5 | Parts by mass |  |  |  |  |  |  |
|  | j-6 | Parts by mass | 75 |  |  |  |  |  |
| Solution containing modified imide resin having an acidic substituent and an aromatic azomethine | k-1 | Parts by mass |  |  |  | 100 |  |  |
|  | k-2 | Parts by mass |  |  |  |  | 100 |  |
|  | k-3 | Parts by mass |  |  |  |  |  | 80 |
|  | k-4 | Parts by mass |  |  |  |  |  |  |
|  | k-5 | Parts by mass |  |  |  |  |  |  |
|  | k-6 | Parts by mass |  |  |  |  |  |  |
| Maleimide compound (D) | BMI | Parts by mass |  |  |  |  |  |  |
|  | BMI-4000 | Parts by mass |  |  |  |  |  |  |

TABLE 5-continued

|  |  | Unit | Example 25 | Example 26 | Example 27 | Example 28 | Example 29 | Example 30 |
|---|---|---|---|---|---|---|---|---|
| Amine compound (E) having an acidic substituent | p-Aminophenol | Parts by mass | 5 | 5 | 5 |  |  |  |
| Thermoplastic elastomer (F) | TUFTEC H1043 | Parts by mass |  |  |  |  |  |  |
|  | EPOFRIEND CT-310 | Parts by mass | 15 | 20 | 20 |  |  | 20 |
| Thermosetting resin (G) | PT-30 | Parts by mass |  |  |  |  |  |  |
|  | NC-7000L | Parts by mass | 5 | 5 | 5 |  |  |  |
| Inorganic filler (H) | SC2050-KNK | Parts by mass |  | 200 | 200 |  |  |  |
|  | KEMGARD 1100 | Parts by mass |  |  | 20 |  |  |  |
| Curing accelerator (I) | Zinc(II) naphthenate | Parts by mass |  |  |  |  |  |  |
|  | G-8009L | Parts by mass |  |  |  | 1.0 | 1.0 |  |
|  | TPP-MK | Parts by mass | 1.0 | 1.0 | 1.0 |  |  | 1.0 |
| Properties of resin plate | (1) Cure shrinkage | % | 0.07 | 0.06 | 0.06 | 0.15 | 0.15 | 0.05 |
| Properties of laminated plate | (2) Glass transition temperature | ° C. | 210 | 210 | 210 | 220 | 220 | 210 |
|  | (3) Coefficient of thermal expansion | ppm/° C. | 5.7 | 5.5 | 5.5 | 6.0 | 6.0 | 5.3 |
|  | (4) Copper foil adhesiveness | kN/m | 0.8 | 0.7 | 0.7 | 1.0 | 1.0 | 0.8 |
|  | (5) Copper-stuck solder heat resistance | — | Not swollen | Not swollen | Not swollen | Not swollen | Not swollen | Not swollen |
|  | (6) Bending elastic modulus | GPa | 29 | 31 | 31 | 30 | 30 | 30 |
|  | (7) Dielectric properties |  |  |  |  |  |  |  |
|  | Dielectric constant | — | 3.9 | 3.9 | 3.9 | 4.1 | 4.1 | 3.8 |
|  | Dielectric tangent | — | 0.006 | 0.005 | 0.005 | 0.008 | 0.008 | 0.006 |

TABLE 6

|  |  | Unit | Example 31 | Example 32 | Example 33 | Example 34 | Example 35 | Example 36 |
|---|---|---|---|---|---|---|---|---|
| Solution containing modified siloxane compound having an aromatic azomethine | i-1 | Parts by mass |  |  |  |  |  |  |
|  | i-2 | Parts by mass |  |  |  |  |  |  |
|  | i-3 | Parts by mass |  |  |  |  |  |  |
|  | i-4 | Parts by mass |  |  |  |  |  |  |
|  | i-5 | Parts by mass |  |  |  |  |  |  |
|  | ii-1 | Parts by mass |  |  |  |  |  |  |
|  | ii-2 | Parts by mass |  |  |  |  |  |  |
|  | ii-3 | Parts by mass |  |  |  |  |  |  |
|  | ii-4 | Parts by mass |  |  |  |  |  |  |
|  | ii-5 | Parts by mass |  |  |  |  |  |  |
|  | iii-1 | Parts by mass |  |  |  |  |  |  |
|  | iii-2 | Parts by mass |  |  |  |  |  |  |
|  | iii-3 | Parts by mass |  |  |  |  |  |  |
|  | iii-4 | Parts by mass |  |  |  |  |  |  |
|  | iii-5 | Parts by mass |  |  |  |  |  |  |
| Solution containing modified imide resin having an aromatic azomethine | j-1 | Parts by mass |  |  |  |  |  |  |
|  | j-2 | Parts by mass |  |  |  |  |  |  |
|  | j-3 | Parts by mass |  |  |  |  |  |  |
|  | j-4 | Parts by mass |  |  |  |  |  |  |
|  | j-5 | Parts by mass |  |  |  |  |  |  |
|  | j-6 | Parts by mass |  |  |  |  |  |  |
| Solution containing modified imide resin having an acidic substituent and an aromatic azomethine | k-1 | Parts by mass |  |  |  |  |  |  |
|  | k-2 | Parts by mass |  |  |  |  |  |  |
|  | k-3 | Parts by mass | 80 |  |  |  | 80 | 80 |
|  | k-4 | Parts by mass |  | 80 |  |  |  |  |
|  | k-5 | Parts by mass |  |  | 70 |  |  |  |
|  | k-6 | Parts by mass |  |  |  | 70 |  |  |
| Maleimide compound (D) | BMI |  Parts by mass |  |  |  |  |  |  |
|  | BMI-4000 | Parts by mass |  |  |  |  |  |  |
| Amine compound (E) having an acidic substituent | p-Aminophenol | Parts by mass |  |  |  |  |  |  |
| Thermoplastic elastomer (F) | TUFTEC H1043 | Parts by mass |  |  |  |  |  |  |
|  | EPOFRIEND CT-310 | Parts by mass | 15 | 15 | 15 | 15 |  |  |
| Thermosetting resin (G) | PT-30 | Parts by mass |  |  | 5 | 5 |  | 20 |
|  | NC-7000L | Parts by mass | 5 | 5 |  |  | 20 |  |
| Inorganic filler (H) | SC2050-KNK | Parts by mass |  |  | 200 | 200 | 200 | 200 |
|  | KEMGARD 1100 | Parts by mass |  |  |  |  | 20 | 20 |

TABLE 6-continued

|  |  | Unit | Example 31 | Example 32 | Example 33 | Example 34 | Example 35 | Example 36 |
|---|---|---|---|---|---|---|---|---|
| Curing accelerator (I) | Zinc(II) naphthenate | Parts by mass |  |  | 0.5 | 0.5 |  | 0.5 |
|  | G-8009L | Parts by mass |  |  |  |  |  |  |
|  | TPP-MK | Parts by mass | 1.0 | 1.0 | 1.0 | 1.0 | 1.0 | 1.0 |
| Properties of resin plate | (1) Cure shrinkage | % | 0.06 | 0.06 | 0.05 | 0.05 | 0.12 | 0.13 |
| Properties of laminated plate | (2) Glass transition temperature | ° C. | 210 | 210 | 210 | 210 | 220 | 220 |
|  | (3) Coefficient of thermal expansion | ppm/° C. | 5.4 | 5.4 | 5.2 | 5.2 | 6.1 | 6.0 |
|  | (4) Copper foil adhesiveness | kN/m | 0.8 | 0.9 | 0.7 | 0.8 | 1.0 | 1.0 |
|  | (5) Copper-stuck solder heat resistance | — | Not swollen | Not swollen | Not swollen | Not swollen | Not swollen | Not swollen |
|  | (6) Bending elastic modulus | GPa | 30 | 30 | 30 | 30 | 34 | 35 |
|  | (7) Dielectric properties |  |  |  |  |  |  |  |
|  | Dielectric constant | — | 3.8 | 3.8 | 3.8 | 3.8 | 4.2 | 4.0 |
|  | Dielectric tangent | — | 0.006 | 0.006 | 0.005 | 0.005 | 0.008 | 0.006 |

TABLE 7

|  |  | Unit | Example 37 | Example 38 | Example 39 |
|---|---|---|---|---|---|
| Solution containing modified siloxane compound having an aromatic azomethine | i-1 | Parts by mass |  |  |  |
|  | i-2 | Parts by mass |  |  |  |
|  | i-3 | Parts by mass |  |  |  |
|  | i-4 | Parts by mass |  |  |  |
|  | i-5 | Parts by mass |  |  |  |
|  | ii-1 | Parts by mass |  |  |  |
|  | ii-2 | Parts by mass |  |  |  |
|  | ii-3 | Parts by mass |  |  |  |
|  | ii-4 | Parts by mass |  |  |  |
|  | ii-5 | Parts by mass |  |  |  |
|  | iii-1 | Parts by mass |  |  |  |
|  | iii-2 | Parts by mass |  |  |  |
|  | iii-3 | Parts by mass |  |  |  |
|  | iii-4 | Parts by mass |  |  |  |
|  | iii-5 | Parts by mass |  |  |  |
| Solution containing modified imide resin having an aromatic azomethine | j-1 | Parts by mass |  |  |  |
|  | j-2 | Parts by mass |  |  |  |
|  | j-3 | Parts by mass |  |  |  |
|  | j-4 | Parts by mass |  |  |  |
|  | j-5 | Parts by mass |  |  |  |
|  | j-6 | Parts by mass |  |  |  |
| Solution containing modified imide resin having an acidic substituent and an aromatic azomethine | k-1 | Parts by mass |  |  |  |
|  | k-2 | Parts by mass |  |  |  |
|  | k-3 | Parts by mass | 80 | 80 | 80 |
|  | k-4 | Parts by mass |  |  |  |
|  | k-5 | Parts by mass |  |  |  |
|  | k-6 | Parts by mass |  |  |  |
| Maleimide compound (D) | BMI | Parts by mass |  |  |  |
|  | BMI-4000 | Parts by mass |  |  |  |
| Amine compound (E) having an acidic substituent | p-Aminophenol | Parts by mass |  |  |  |
| Thermoplastic elastomer (F) | TUFTEC H1043 | Parts by mass |  | 20 |  |
|  | EPOFRIEND CT-310 | Parts by mass | 20 |  | 20 |
| Thermosetting resin (G) | PT-30 | Parts by mass |  |  |  |
|  | NC-7000L | Parts by mass |  |  |  |
| Inorganic filler (H) | SC2050-KNK | Parts by mass | 200 | 200 | 300 |
|  | KEMGARD 1100 | Parts by mass | 20 | 20 |  |
| Curing accelerator (I) | Zinc(II) naphthenate | Parts by mass |  |  |  |
|  | G-8009L | Parts by mass |  |  |  |
|  | TPP-MK | Parts by mass | 1.0 | 1.0 | 1.0 |
| Properties of resin plate | (1) Cure shrinkage | % | 0.04 | 0.05 | 0.03 |
| Properties of laminated plate | (2) Glass transition temperature | ° C. | 210 | 210 | 210 |
|  | (3) Coefficient of thermal expansion | ppm/° C. | 5.0 | 5.3 | 4.8 |
|  | (4) Copper foil adhesiveness | kN/m | 0.8 | 0.8 | 0.8 |

TABLE 7-continued

|  |  | Unit | Example 37 | Example 38 | Example 39 |
|---|---|---|---|---|---|
|  | (5) Copper-stuck solder heat resistance | — | Not swollen | Not swollen | Not swollen |
|  | (6) Bending elastic modulus | GPa | 33 | 33 | 35 |
|  | (7) Dielectric properties |  |  |  |  |
|  | Dielectric constant | — | 3.7 | 3.7 | 3.7 |
|  | Dielectric tangent | — | 0.004 | 0.004 | 0.004 |

TABLE 8

|  |  | Unit | Comparative Example 1 | Comparative Example 2 | Comparative Example 3 | Comparative Example 4 | Comparative Example 5 | Comparative Example 6 |
|---|---|---|---|---|---|---|---|---|
| Aromatic amine compound (A) | KAYAHARD A-A | Parts by mass | 4 |  | 2 |  | 4 |  |
|  | 4,4'-Diaminobenzanilide | Parts by mass |  | 2 |  |  |  | 4 |
|  | 4-Aminophenyl-4'-aminobenzoate | Parts by mass |  |  |  | 2 |  |  |
| Aromatic aldehyde compound (B) | Terephthalaldehyde | Parts by mass | 2 | 2 | 4 | 4 | 2 | 2 |
| Siloxane compound (C) | X-22-161B | Parts by mass | 4 | 4 | 2 | 2 | 4 | 4 |
| Maleimide compound (D) | BMI | Parts by mass | 90 | 90 |  |  |  |  |
|  | BMI-4000 | Parts by mass |  |  | 80 | 80 | 65 | 65 |
| Amine compound (E) having an acidic substituent | p-Aminophenol | Parts by mass |  |  | 12 | 12 | 5 | 5 |
| Thermoplastic elastomer (F) | TUFTEC H1043 | Parts by mass |  |  |  |  |  |  |
|  | EPOFRIEND CT-310 | Parts by mass |  |  |  |  | 20 | 20 |
| Thermosetting resin (G) | PT-30 | Parts by mass |  |  |  |  |  |  |
|  | NC-7000L | Parts by mass |  |  |  |  |  |  |
| Inorganic filler (H) | SC2050-KNK | Parts by mass |  |  |  |  |  |  |
|  | KEMGARD 1100 | Parts by mass |  |  |  |  |  |  |
| Curing accelerator (I) | Zinc(II) naphthenate | Parts by mass |  |  |  |  |  |  |
|  | G-8009L | Parts by mass | 1.0 | 1.0 |  |  |  |  |
|  | TPP-MK | Parts by mass |  |  | 1.0 | 1.0 | 1.0 | 1.0 |
| Properties of resin plate | (1) Cure shrinkage | % | 0.32 | 0.31 | 0.45 | 0.45 | 0.20 | 0.19 |
| Properties of laminated plate | (2) Glass transition temperature | °C. | 200 | 200 | 190 | 190 | 180 | 180 |
|  | (3) Coefficient of thermal expansion | ppm/°C. | 6.6 | 6.4 | 7.3 | 7.3 | 6.8 | 6.6 |
|  | (4) Copper foil adhesiveness | kN/m | 0.4 | 0.4 | 0.6 | 0.6 | 0.4 | 0.4 |
|  | (5) Copper-stuck solder heat resistance | — | Swollen | Swollen | Swollen | Swollen | Not swollen | Not swollen |
|  | (6) Bending elastic modulus | GPa | 30 | 30 | 28 | 28 | 25 | 25 |
|  | (7) Dielectric properties |  |  |  |  |  |  |  |
|  | Dielectric constant | — | 4.2 | 4.2 | 4.2 | 4.2 | 4.1 | 4.1 |
|  | Dielectric tangent | — | 0.010 | 0.010 | 0.010 | 0.010 | 0.007 | 0.007 |

TABLE 9

|  |  | Unit | Comparative Example 7 | Comparative Example 8 | Comparative Example 9 | Comparative Example 10 | Comparative Example 11 | Comparative Example 12 |
|---|---|---|---|---|---|---|---|---|
| Aromatic amine compound (A) | KAYAHARD A-A | Parts by mass | 4 |  | 4 |  | 4 |  |
|  | 4,4'-Diaminobenzanilide | Parts by mass |  |  |  | 4 |  | 4 |
|  | 4-Aminophenyl-4'-aminobenzoate | Parts by mass |  | 4 |  |  |  |  |
| Aromatic aldehyde compound (B) | Terephthalaldehyde | Parts by mass | 2 | 2 | 2 | 2 | 2 | 2 |
| Siloxane compound (C) | X-22-161B | Parts by mass | 4 | 4 | 4 | 4 | 4 | 4 |
| Maleimide compound (D) | BMI | Parts by mass |  |  |  |  |  |  |
|  | BMI-4000 | Parts by mass | 65 | 65 | 65 | 65 | 65 | 65 |

TABLE 9-continued

| | | Unit | Comparative Example 7 | Comparative Example 8 | Comparative Example 9 | Comparative Example 10 | Comparative Example 11 | Comparative Example 12 |
|---|---|---|---|---|---|---|---|---|
| Amine compound (E) having an acidic substituent | p-Aminophenol | Parts by mass | 5 | 5 | 5 | 5 | 5 | 5 |
| Thermoplastic elastomer (F) | TUFTEC H1043 | Parts by mass | | | | | | |
| Thermosetting resin (G) | EPOFRIEND CT-310 | Parts by mass | 15 | 15 | 15 | 15 | 20 | 20 |
| | PT-30 | Parts by mass | | | | | | |
| | NC-7000L | Parts by mass | 5 | 5 | 5 | 5 | | |
| Inorganic filler (H) | SC2050-KNK | Parts by mass | | | 200 | 200 | 300 | 300 |
| | KEMGARD 1100 | Parts by mass | | | | | | |
| Curing accelerator (I) | Zinc(II) naphthenate | Parts by mass | | | | | | |
| | G-8009L | Parts by mass | | | | | | |
| | TPP-MK | Parts by mass | 1.0 | 1.0 | 1.0 | 1.0 | 1.0 | 1.0 |
| Properties of resin plate | (1) Cure shrinkage | % | 0.24 | 0.24 | 0.21 | 0.20 | 0.18 | 0.18 |
| Properties of laminated plate | (2) Glass transition temperature | ° C. | 190 | 190 | 190 | 190 | 180 | 180 |
| | (3) Coefficient of thermal expansion | ppm/° C. | 7.1 | 7.1 | 7.0 | 6.9 | 6.4 | 6.4 |
| | (4) Copper foil adhesiveness | kN/m | 0.6 | 0.6 | 0.6 | 0.6 | 0.4 | 0.4 |
| | (5) Copper-stuck solder heat resistance | — | Not swollen | Not swollen | Not swollen | Not swollen | Not swollen | Not swollen |
| | (6) Bending elastic modulus | GPa | 26 | 26 | 27 | 27 | 27 | 27 |
| | (7) Dielectric properties | | | | | | | |
| | Dielectric constant | — | 4.1 | 4.1 | 4.1 | 4.1 | 4.0 | 4.0 |
| | Dielectric tangent | — | 0.010 | 0.010 | 0.009 | 0.009 | 0.008 | 0.008 |

As is clear from Tables 1 to 9, in the Examples of the present invention, the resin plates are small in the cure shrinkage and excellent in the low cure shrinkage. In addition, so far as the properties of the laminated plates are concerned, the Examples are also excellent in the coefficient of thermal expansion, copper foil adhesiveness, elastic modulus, and dielectric properties.

On the other hand, in the Comparative Examples, the resin plates are large in the cure shrinkage. In addition, so far as the properties of the laminated plates are concerned, the Comparative Examples are inferior to the Examples in all of the properties including coefficient of thermal expansion, copper foil adhesiveness, elastic modulus, and dielectric properties.

Industrial Applicability

A prepreg obtained by impregnating or coating a base material with a thermosetting resin composition containing the siloxane compound of the present invention, a film with resin obtained by coating a support with the thermosetting resin composition, and a laminated plate prepared by subjecting the prepreg to laminate molding have especially low cure shrinkage, low thermal expansion properties, copper foil adhesiveness, high elastic modulus, and excellent dielectric properties and are useful as a highly integrated semiconductor package and a multilayer printed wiring board for electronic devices.

The invention claimed is:
1. A modified imide resin having an aromatic azomethine, obtained by allowing a siloxane compound and a maleimide compound (D) having at least two N-substituted maleimide groups in one molecule thereof to react with each other,
the siloxane compound containing an amino group, an aromatic azomethine, and structures represented by the following general formulae (1) and (2):

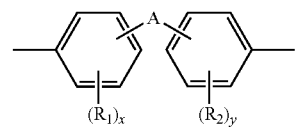

(1)

wherein each of $R_1$ and $R_2$ independently represents a hydrogen atom, a halogen atom, an alkyl group having from 1 to 3 carbon atoms, a halogenated alkyl group, a thiol group, an acetyl group, a hydroxyl group, a sulfonic acid group, a sulfoalkoxyl group having from 1 to 3 carbon atoms, or an alkoxyl group having from 1 to 3 carbon atoms; each of x and y independently represents an integer of from 0 to 4; and A represents a single bond or an azomethine group, an ester group, an amide group, an azoxy group, an azo group, an ethylene group, or an acetylene group, and

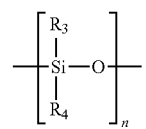

(2)

wherein each of $R_3$ and $R_4$ independently represents an alkyl group, a phenyl group, or a substituted phenyl group; and n represents an integer of from 19 to 100.

2. The modified imide resin of claim 1, the siloxane compound obtained by allowing an aromatic amine compound (A) having at least two primary amino groups in one molecule thereof, an aromatic aldehyde compound (B) having at least two aldehyde groups in one molecule thereof, and a siloxane compound (C) having at least two amino groups in a molecular terminal thereof to react with each other.

3. The modified imide resin of claim 1, the siloxane compound obtained by allowing an aromatic amine compound (A) having at least two primary amino groups in one molecule thereof and an aromatic aldehyde compound (B) having at least two aldehyde groups in one molecule thereof to react with each other, followed by reaction with a siloxane compound (C) having at least two amino groups in a molecular terminal thereof.

4. The modified imide resin of claim 1, the siloxane compound obtained by allowing an aromatic aldehyde compound (B) having at least two aldehyde groups in one molecule thereof and a siloxane compound (C) having at least two amino groups in a molecular terminal thereof to react with each other, followed by reaction with an aromatic amine compound (A) having at least two primary amino groups in one molecule thereof.

5. The modified imide resin according to claim 1, further having an acidic substituent, the acidic substituent being derived from an acidic substituent of an amine compound (E) represented by the following general formula (3):

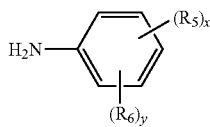

(3)

wherein each $R_5$ independently represents a hydroxyl group, a carboxyl group, or a sulfonic acid group, each of which is an acidic substituent; each $R_6$ independently represents a hydrogen atom, an aliphatic hydrocarbon group having from 1 to 5 carbon atoms, or a halogen atom; x represents an integer of from 1 to 5; and y represents an integer of from 0 to 4, provided that the sum of x and y is 5.

6. A thermosetting resin composition containing a siloxane compound and a maleimide compound (D) having at least two N-substituted maleimide groups in one molecule thereof, the siloxane compound containing an amino group, an aromatic azomethine, and structures represented by the following general formulae (1) and (2):

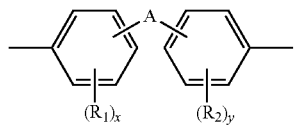

(1)

wherein each of $R_1$ and $R_2$ independently represents a hydrogen atom, a halogen atom, an alkyl group having from 1 to 3 carbon atoms, a halogenated alkyl group, a thiol group, an acetyl group, a hydroxyl group, a sulfonic acid group, a sulfoalkoxy group having from 1 to 3 carbon atoms, or an alkoxyl group having from 1 to 3 carbon atoms; each of x and y independently represents an integer of from 0 to 4; and A represents a single bond or an azomethine group, an ester group, an amide group, an azoxy group, an azo group, an ethylene group, or an acetylene group, and

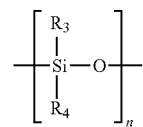

(2)

wherein each of $R_3$ and $R_4$ independently represents an alkyl group, a phenyl group, or a substituted phenyl group; and n represents an integer of from 19 to 100.

7. The thermosetting resin composition according to claim 6, further containing an amine compound (E) having an acidic substituent, which is represented by the following general formula (3):

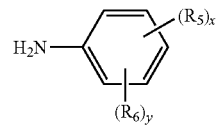

(3)

wherein each $R_5$ independently represents a hydroxyl group, a carboxyl group, or a sulfonic acid group, each of which is an acidic substituent; each $R_6$ independently represents a hydrogen atom, an aliphatic hydrocarbon group having from 1 to 5 carbon atoms, or a halogen atom; x represents an integer of from 1 to 5; and y represents an integer of from 0 to 4, provided that the sum of x and y is 5.

8. The thermosetting resin composition according to claim 6, further containing a thermoplastic elastomer (F).

9. The thermosetting resin composition according to claim 6, further containing at least one thermosetting resin (G) selected from an epoxy resin and a cyanate resin.

10. The thermosetting resin composition according to claim 6, further containing an inorganic filler (H).

11. The thermosetting resin composition according to claim 6, further containing a curing accelerator (I).

12. A prepreg comprising a base material impregnated with the thermosetting resin composition according to claim 6.

13. A laminated plate, obtained by subjecting the prepreg according to claim 12 to laminate molding.

14. A multilayer printed wiring board, prepared using the laminated plate according to claim 13.

15. A semiconductor package comprising a semiconductor device mounted on the multilayer printed wiring board according to claim 14.

16. A film with resin comprising a support subjected to layer forming with the thermosetting resin composition according to claim 6.

17. A laminated plate, obtained by subjecting the film with resin according to claim 16 to laminate molding.

* * * * *